United States Patent
Toyoda et al.

(10) Patent No.: US 8,173,050 B2
(45) Date of Patent: May 8, 2012

(54) CONDUCTIVE PATTERN FORMATION INK, CONDUCTIVE PATTERN AND WIRING SUBSTRATE

(75) Inventors: Naoyuki Toyoda, Suwa (JP); Toshiyuki Kobayashi, Chino (JP); Sachiko Endo, Tatsuno (JP); Noboru Uehara, Okaya (JP); Akihiko Tsunoya, Suwa (JP)

(73) Assignee: Seiko Epson Corporation (JP)

( * ) Notice: Subject to any disclaimer, the term of this patent is extended or adjusted under 35 U.S.C. 154(b) by 487 days.

(21) Appl. No.: 12/331,687

(22) Filed: Dec. 10, 2008

(65) Prior Publication Data
US 2009/0145638 A1 Jun. 11, 2009

(30) Foreign Application Priority Data
Dec. 11, 2007 (JP) .................................. 2007-320244

(51) Int. Cl.
*H01B 1/20* (2006.01)
(52) U.S. Cl. .................. 252/514; 252/518.1; 252/519.3; 252/520.3; 252/521.6; 106/1.13; 106/1.14; 106/802; 977/773; 977/775; 977/777; 977/788
(58) Field of Classification Search .......... 252/500–511, 252/518.1, 514, 519.3 J, 520.3, 521.6; 106/1.13, 106/1.14, 802, 31; 977/773, 775, 777, 788
See application file for complete search history.

(56) References Cited

U.S. PATENT DOCUMENTS

| | | | |
|---|---|---|---|
| 6,114,411 A | 9/2000 | Nakamura et al. | |
| 6,447,679 B1 | 9/2002 | Watari et al. | |
| 6,500,248 B1* | 12/2002 | Hayashi | 106/31.86 |
| 6,824,261 B2 | 11/2004 | Watari et al. | |
| 6,858,063 B2 | 2/2005 | Watari et al. | |
| 6,860,922 B2 | 3/2005 | Watari et al. | |
| 2002/0002931 A1* | 1/2002 | Nakano et al. | 106/31.58 |
| 2005/0214480 A1* | 9/2005 | Garbar et al. | 428/1.1 |
| 2006/0098069 A1* | 5/2006 | Cornell et al. | 347/101 |
| 2006/0177951 A1* | 8/2006 | Hirai | 438/22 |
| 2006/0240259 A1 | 10/2006 | Toyoda et al. | |
| 2007/0289483 A1* | 12/2007 | Cho et al. | 106/31.13 |
| 2008/0187651 A1* | 8/2008 | Lee et al. | 427/77 |
| 2008/0206488 A1* | 8/2008 | Chung et al. | 427/596 |

(Continued)

FOREIGN PATENT DOCUMENTS

JP 09-176533 7/1997

(Continued)

*Primary Examiner* — Mark Kopec
*Assistant Examiner* — Tri V Nguyen
(74) *Attorney, Agent, or Firm* — Harness, Dickey & Pierce, P.L.C.

(57) ABSTRACT

A conductive pattern formation ink which can be stably ejected in the form of liquid droplets and form a conductive pattern having high reliability, a conductive pattern having high reliability, and a wiring substrate provided with the conductive pattern and having high reliability are provided. The conductive pattern formation ink is used for forming a conductive pattern by ejecting the ink in the form of liquid droplets on a surface of a ceramic molded body using a liquid droplet ejecting method, the ceramic molded body being made of a material containing ceramic particles and a binder. The ink contains a water-based dispersion medium, and metal particles dispersed in the water-based dispersion medium, wherein the water-based dispersion medium contains oxygen molecules and nitrogen molecules, and wherein when the water-based dispersion medium is analyzed using a gas chromatography method, a total amount of the oxygen and nitrogen molecules contained in the water-based dispersion medium is 12 ppm or less.

10 Claims, 5 Drawing Sheets

U.S. PATENT DOCUMENTS

| | | | |
|---|---|---|---|
| 2008/0236444 A1* | 10/2008 | Enciu et al. | 106/31.13 |
| 2009/0025605 A1* | 1/2009 | Ishimaru et al. | 106/31.86 |
| 2009/0145640 A1* | 6/2009 | Toyoda | 174/257 |

FOREIGN PATENT DOCUMENTS

| | | |
|---|---|---|
| JP | 11-209670 | 8/1999 |
| JP | 2001-106949 | 4/2001 |
| JP | 2003-133692 | 5/2003 |
| JP | 2003-311196 | 11/2003 |
| JP | 2004-185952 | 7/2004 |
| JP | 2006-009120 | 1/2006 |
| JP | 2006-299348 | 11/2006 |
| JP | 2007-084387 | 4/2007 |
| JP | 2007-084699 | 4/2007 |
| JP | 2007-137068 | 6/2007 |
| WO | WO2006093398 * | 9/2006 |

* cited by examiner

CONDUCTIVE PATTERN FORMATION INK, CONDUCTIVE PATTERN AND WIRING SUBSTRATE

CROSS-REFERENCE TO RELATED APPLICATION

This application claims a priority to Japanese Patent Application No. 2007-320244 filed on Dec. 11, 2007 which is hereby expressly incorporated by reference herein in its entirety.

BACKGROUND

1. Technical Field

The present invention relates to a conductive pattern formation ink, a conductive pattern and a wiring substrate, and more specifically relates to a conductive pattern formation ink, a conductive pattern formed by the conductive pattern formation ink and a wiring substrate provided with the conductive pattern.

2. Related Art

A ceramic circuit substrate including a substrate (a ceramic substrate) formed of a ceramic material and a wiring formed of a metal material and provided on the substrate has been widely used as a circuit substrate (a wiring substrate) on which electronic parts are to be mounted.

In such a ceramic circuit substrate, the substrate (the ceramic substrate) itself is formed of a multifunctional material such as the ceramic material. Therefore, there are merits in that if a multilayer substrate is produced using a plurality of such substrates, inner layer parts can be formed easily between the substrates with high dimensional accuracy.

Such a ceramic circuit substrate can be produced by supplying a composition containing metal particles on a ceramic molded body made of a material containing ceramic particles and a binder in a predetermined pattern corresponding to a pattern of wirings (a conductive pattern) to be formed, and then subjecting the ceramic molded body on which the composition is supplied to a degreasing and sintering treatment.

A screen printing method has been widely used as a method of forming a pattern on the ceramic molded body. On the other hand, recently, miniaturization of the wirings and reduction of pitches between the wirings are required for densification of the ceramic circuit substrate.

However, use of the screen printing method has disadvantage for the miniaturization of the wirings (e.g., formation of wirings each having a line width of about 60 μm or less) and the reduction of the pitches between the wirings. As a result, it is difficult to respond to the above requirement.

For this reason, recently, as an alternative method of forming the pattern on the ceramic molded body, there has been proposed use of what is called an ink jet method, i.e., a liquid droplet ejecting method by which a liquid material (a conductive pattern formation ink) containing metal particles is ejected in the form of liquid droplets from a liquid droplet ejection head, (see, e.g., JP-A-2007-84387).

Meanwhile, an industrial liquid droplet ejection apparatus to be used for forming the conductive pattern is clearly different from a consumer liquid droplet ejection apparatus to be used in a printer. For example, in order to produce a large quantity of products, the industrial liquid droplet ejection apparatus must be able to eject the great number of liquid droplets continuously for a long period of time.

Further, in general, fluid cut of an industrial ink to be used for forming the conductive pattern when ejecting it is worse than that of a consumer ink to be used in the printer. As a result, the industrial ink is apt to remain in ejection portions (nozzles) of the liquid droplet ejection head.

Furthermore, clogging of the ejection portions of the liquid droplet ejection head is likely to occur due to aggregation of solid contents such as the metal particles contained in the industrial ink. This frequently causes changes of ejecting directions of the liquid droplets. Such unstability of an ejecting property of the liquid droplets makes it impossible to form a fine conductive pattern using the industrial ink.

SUMMARY

It is an object of the present invention to provide a conductive pattern formation ink which can be stably ejected in the form of liquid droplets and form a conductive pattern having high reliability, a conductive pattern formed by the conductive pattern formation ink and having high reliability, and a wiring substrate provided with the conductive pattern and having high reliability.

In order to achieve the object, a first aspect of the present invention is directed to a conductive pattern formation ink for forming a conductive pattern by ejecting the ink in the form of liquid droplets on a surface of a ceramic molded body using a liquid droplet ejecting method, the ceramic molded body being made of a material containing ceramic particles and a binder.

The conductive pattern formation ink comprises a water-based dispersion medium, and metal particles dispersed in the water-based dispersion medium, wherein the water-based dispersion medium contains oxygen molecules and nitrogen molecules, and wherein when the water-based dispersion medium is analyzed using a gas chromatography method, a total amount of the oxygen and nitrogen molecules contained in the water-based dispersion medium is 12 ppm or less.

In the case where the total amount of the oxygen and nitrogen molecules contained in the water-based dispersion medium is sufficiently low as described above, it is possible to prevent aggregation of the metal particles in the ink. Further, it is also possible to prevent generation of air bubbles in the ink during an ejecting operation thereof. This makes it possible to improve ejection stability of the liquid droplets of the ink.

For these reasons, it is possible to provide a conductive pattern formation ink which can be stably ejected in the form of the liquid droplets and form a conductive pattern having high reliability.

It is preferred that the conductive pattern formation ink of the present invention further contains a surface tension adjuster that is contained in the water-based dispersion medium and adjusts surface tension of the ink, wherein the surface tension adjuster contains a compound represented by the following formula (I):

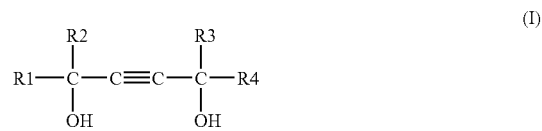

wherein each of R1, R2, R3 and R4 is independently a hydrogen atom or an alkyl group.

This makes it possible to sufficiently enhance adhesiveness of the ink to the surface of the ceramic molded body, and to particularly improve the ejection stability of the liquid droplets of the ink with a relatively small additive amount of the surface tension adjuster. This also makes it possible to improve dispersion stability of the metal particles in the ink. As a result, storage stability and reliability of the ink become particularly excellent.

In the conductive pattern formation ink of the present invention, it is preferred that in the formula (I), the R1 and the R4 have the same chemical structure and the R2 and the R3 have the same chemical structure.

This makes it possible to preferably prevent the generation of the air bubbles in the ink and to more easily remove the air bubbles contained in the ejected liquid droplets even if they are generated therein. As a result, it is possible to sufficiently enhance adhesiveness of the ink to the surface of the ceramic molded body, and to particularly improve the ejection stability of the ink with a relatively small additive amount of the surface tension adjuster.

In the conductive pattern formation ink of the present invention, it is preferred that a HLB value of the surface tension adjuster is in the range of 2 to 16.

This makes it possible to more easily adjust a contact angle of the ink with respect to the surface of the ceramic molded body to a predetermined range.

In the conductive pattern formation ink of the present invention, it is preferred that the ink contains two or more kinds of the surface tension adjusters having different HLB values, and a HLB value difference between the surface tension adjuster having the highest HLB value and the surface tension adjuster having the lowest HLB value is in the range of 4 to 12.

This makes it possible to sufficiently enhance adhesiveness of the ink to the surface of the ceramic molded body, and to particularly improve the ejection stability of the liquid droplets of the ink with a relatively small additive amount of the surface tension adjuster.

In the conductive pattern formation ink of the present invention, it is preferred that an amount of the surface tension adjuster contained in the ink is in the range of 0.001 to 1 wt %.

This makes it possible to sufficiently enhance adhesiveness of the ink to the surface of the ceramic molded body, and to particularly improve the ejection stability of the liquid droplets of the ink with a relatively small additive amount of the surface tension adjuster.

It is preferred that the conductive pattern formation ink of the present invention further comprises a polyether compound.

In the case where the ink contains the above polyether compound, the ejection stability of the liquid droplets of the ink can be improved, and spread of the liquid droplets landed on the surface of the ceramic molded body can be suppressed so that increase of diameters thereof is prevented. Since the thus formed conductive pattern does not have any crack, it can have high reliability.

In the conductive pattern formation ink of the present invention, it is preferred that a surface tension of the ink at 25° C. is in the range of 15 to 45 dyn/cm.

In this case, the ejection stability of the liquid droplets of the ink can be improved, and spread of the liquid droplets landed on the surface of the ceramic molded body can be suppressed so that increase of diameters thereof is prevented. This makes it possible to form a conductive pattern having particularly high reliability.

In the conductive pattern formation ink of the present invention, it is preferred that a viscosity of the ink at 25° C. is in the range of 3 to 15 mPa·s.

In this case, the ejection stability of the liquid droplets of the ink can be improved, and spread of the liquid droplets landed on the surface of the ceramic molded body can be suppressed so that increase of diameters thereof is prevented. This makes it possible to form a conductive pattern having particularly high reliability.

In the conductive pattern formation ink of the present invention, it is preferred that the ink is degassed using a gas permeable membrane method.

Use of the gas permeable membrane method makes it possible to reliably degas the ink, while preventing a change of a composition of the ink, and to maintain the amount of gas molecules (the oxygen and nitrogen molecules) dissolved in the degassed ink to a lower level for a very long period of time.

In the conductive pattern formation ink of the present invention, it is preferred that each liquid droplet is landed on the surface of the ceramic molded body in a state that the ceramic molded body is heated at a temperature in the range of 40 to 100° C.

By setting the temperature in heating the ceramic molded body to the above range, it is possible to more reliably prevent spread of each liquid droplet landed on the surface of the ceramic molded body. This makes it possible to reliably control diameter of each liquid droplet landed on the surface and hence a line width of each wiring constituting the conductive pattern.

In addition, it is also possible to further improve the ejection stability of the liquid droplets of the ink, even in the case where the ceramic molded body is heated at such a high temperature.

A second aspect of the present invention is directed to a conductive pattern formed using the above conductive pattern formation ink.

Such a conductive pattern can have high reliability.

A third aspect of the present invention is directed to a wiring substrate provided with the above conductive pattern.

Such a wiring substrate can have high reliability.

DESCRIPTION OF EXEMPLARY EMBODIMENTS

Figure 1:
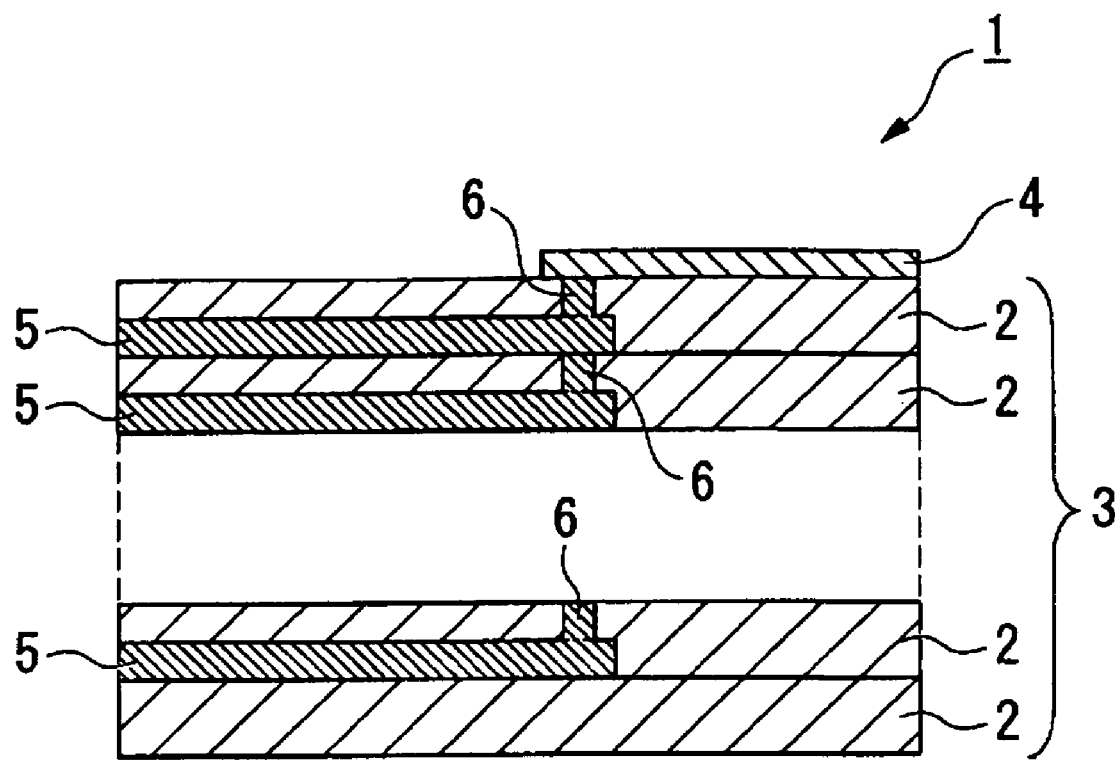
FIG. 1 is a longitudinal section view showing one example of a wiring substrate according to the present invention (a ceramic circuit substrate).

Embodiments of the present invention will be described in detail with reference to the accompanying drawings.

Conductive Pattern Formation Ink

A conductive pattern formation ink of the present invention is an ink for forming a conductive pattern by applying it on a surface of a ceramic molded body made of a material containing ceramic particles and a binder.

Specifically, the conductive pattern formation ink is used for forming the conductive pattern by ejecting it in the form of liquid droplets on the surface of the ceramic molded body using a liquid droplet ejecting method.

Hereinafter, description will be made on a preferred embodiment of the conductive pattern formation ink. In this embodiment, description will be representatively offered regarding a case that a colloid solution in which silver colloid particles are dispersed in a water-based dispersion medium is used as a dispersion solution in which metal particles are dispersed in a water-based dispersion medium.

The conductive pattern formation ink (hereinafter simply referred to "ink" on occasion) of this embodiment is comprised of the colloid solution including the water-based dispersion medium, and the silver colloid particles dispersed in the water-based dispersion medium.

Meanwhile, an industrial liquid droplet ejection apparatus to be used for forming the conductive pattern is clearly different from a consumer liquid droplet ejection apparatus to be used in a printer. For example, in order to produce a large quantity of products, the industrial liquid droplet ejection apparatus must be able to eject the great number of liquid droplets continuously for a long period of time.

Further, in general, fluid cut of an industrial ink to be used for forming the conductive pattern when ejecting it is worse than that of a consumer ink to be used in the printer. As a result, the industrial ink is apt to remain in ejection portions (nozzles) of the liquid droplet ejection head.

Furthermore, clogging of the ejection portions of the liquid droplet ejection head is likely to occur due to aggregation of solid contents such as metal particles contained in the industrial ink. This frequently causes changes of ejecting directions of the liquid droplets. Such unstability of an ejecting property of the liquid droplets makes it impossible to form a fine conductive pattern using the industrial ink.

Accordingly, the present inventors have paid attention to specific formation conditions in forming the above mentioned conductive pattern using the liquid droplet ejecting method. They have earnestly studied based on an idea that the formation conditions greatly affect the above mentioned problems, as a result of which they have found the following cause.

Specifically, among the formation conditions, the present inventors have studied based on an idea that physical properties of the ink such as a viscosity thereof, dispersion stability of the metal particles in the ink and the like are required in order to stably eject a large amount of the ink for a long period of time in forming the above mentioned conductive pattern using the liquid droplet ejecting method.

As a result, they have found that an amount of gas molecules contained (dissolved) in the ink greatly affects the physical properties of the ink and the dispersion stability of the metal particles in the ink, so that ejection stability of the liquid droplets of the ink is changed.

Hereinafter, this cause will be described in more detail. In the case where the ink makes contact with outside air, gas molecules contained in the outside air are dissolved and absorbed in the ink. In this case, there is a problem in that the gas molecules absorbed react with molecules of ingredients constituting the ink, to thereby lower storage stability of the ink for a long period of time.

Specifically, if the gas molecules are dissolved in the ink, the silver colloid particles are apt to be aggregated. Further, if an amount of the gas molecules dissolved in the ink becomes larger, air bubbles are apt to be generated in the ink during an ejecting operation thereof. In the case where air bubbles are generated in the ink stored in the liquid droplet ejection head, they inhibit transmission of ejection pressure to the ink so that it is difficult to supply the ink to the ejection portions. For these reasons, the ejection stability of the ink is lowered.

Further, when the ink is loaded to the liquid droplet ejection apparatus in a state that the gas molecules are contained in the ink, air bubbles and the like are apt to be generated in the ink. Therefore, in the case where the air bubbles are generated in the ink within an ink flow path of the liquid droplet ejection apparatus and accumulated therewithin, a large amount of the ink needs to be loaded to the liquid droplet ejection apparatus in order to remove the air bubbles from the ink flow path so as to stably eject the ink.

As a result of the above study of the present inventors, they have found that, by setting a total amount of oxygen and nitrogen molecules contained (dissolved) in the water-based dispersion medium of the ink to 12 ppm or less, the above mentioned problem can be resolved, that is, the ink can have excellent prolonged storage stability as well as superior ejection stability.

In the case where the total amount of the oxygen and nitrogen molecules contained in the water-based dispersion medium is sufficiently low as described above, it is possible to prevent the aggregation of the silver colloid particles in the ink. It is also possible to prevent the generation of the air bubbles in the ink during the ejecting operation thereof. This makes it possible to improve the ejection stability of the liquid droplets (the ink).

Further, when the ink is loaded to the liquid droplet ejection apparatus, the generation of the air bubbles in the ink can be prevented. Therefore, it is possible to reduce an amount of the ink required until being stably ejected. In addition, a time for loading the ink to the liquid droplet ejection apparatus becomes short. This makes it possible to improve productivity of the conductive pattern.

On the other hand, if the total amount of the oxygen and nitrogen molecules contained in the water-based dispersion medium exceeds the upper limit value noted above, air bubbles are apt to be generated in the ink during the ejecting operation thereof. Further, in this case, the silver colloid particles are apt to be aggregated in the ink. For these reasons, it becomes difficult to stably eject the liquid droplets of the ink.

When the ink is loaded to the liquid droplet ejection apparatus, a large amount thereof needs to be used, and it takes a long time to perform the loading operation thereof. This means that the productivity of the conductive pattern is inferior.

In the present invention, it is preferred that the total amount of the oxygen and nitrogen molecules contained in the water-based dispersion medium is within the above range, but is preferably 10 ppm or less, and more preferably 7 ppm or less. This makes it possible for the ink to exhibit the above mentioned effects noticeably.

In this regard, examples of the gas molecules dissolved in the ink include the oxygen molecules, the nitrogen molecules, carbon dioxide molecules and the like. However, since an amount of the carbon dioxide molecules contained in an air atmosphere is lower than those of the oxygen and nitrogen molecules contained therein, it is conceived that an amount of the carbon dioxide molecules dissolved in the ink is also far lower than those of the oxygen molecules and the nitrogen molecules dissolved therein.

For this reason, in the present invention, the total amount of the oxygen and nitrogen molecules dissolved in the water-based dispersion medium is used as an index of an amount of the gas molecules dissolved in the water-based dispersion medium.

Further, such a total amount of the oxygen and nitrogen molecules dissolved in the water-based dispersion medium is measured by analyzing the water-based dispersion medium using a gas chromatography method. For example, such a gas chromatography method can be performed on a column having a filling material made of molecular sieve (zeolite) with argon gas as a carrier gas (relatively low flow rate) at a relatively low temperature.

A viscosity of the conductive pattern formation ink at 25° C. is preferably in the range of 3 to 15 mPa·s, and more preferably in the range of 4 to 11 mPa·s. This makes it possible to stably eject the liquid droplets of the ink from the liquid droplet ejection apparatus (an ink jet apparatus), and to reliably prevent the liquid droplets each landed on the surface of the ceramic molded body from spreading excessively.

A surface tension of the conductive pattern formation ink at 25° C. is in the range of 15 to 45 dyn/cm, and more preferably in the range of 20 to 40 dyn/cm. This makes it possible to stably eject the liquid droplets of the ink from the liquid droplet ejection apparatus, and to reliably prevent the liquid droplets each landed on the surface of the ceramic molded body from spreading excessively.

It is preferred that the ink has the following property. Namely, when one liquid droplet of the ink having a volume of 10 pL is ejected and then landed on the surface of the ceramic molded body, a diameter of the landed liquid droplet on the surface is preferably in the range of 25 to 45 μm, and more preferably in the range of 30 to 40 μm.

This makes it possible to further uniform the diameters of the liquid droplets landed on the surface of the ceramic molded body, to thereby form a fine conductive pattern having high reliability more certainly.

Hereinafter, description will be made on respective ingredients constituting the conductive pattern formation ink in detail.

Water-Based Dispersion Medium

First, description will be made on the water-based dispersion medium. In this embodiment, the term "water-based dispersion medium" means a liquid constituted from water and/or a liquid having good compatibility with water (that is, a liquid having solubility of 30 g or higher with respect to water of 100 g at 25° C.).

As described above, the water-based dispersion medium is constituted from water and/or a liquid having good compatibility with the water, but it is preferred that the water-based dispersion medium is mainly constituted from the water. In this regard, an amount of the water contained in the water-based dispersion medium is preferably 70 wt % or more, and more preferably 90 wt % or more.

Examples of such a water-based dispersion medium include water; an alcohol-based solvent such as methanol, ethanol, butanol, propanol or isopropanol; an ether-based solvent such as 1,4-dioxane or tetrahydrofuran (THF); an aromatic heterocyclic compound-based solvent such as pyridine, pyrazine or pyrrole; an amide-based solvent such as N,N-dimethylformamide (DMF) or N,N-dimethylacetamide (DMA); a nitrile-based solvent such as acetonitrile; an aldehyde-based solvent such as acetaldehyde; and the like, one or more of which may be used independently or in combination.

Silver Colloid Particles

Next, description will be made on the silver colloid particles. The term "silver colloid particles" means silver particles each adsorbing (or carrying) a dispersant on a surface thereof.

It is preferred that the dispersant is formed of a hydroxy acid or a salt thereof having three or more COOH and OH groups in a total number, wherein the number of the COOH groups is equal to or greater than the number of the OH group(s). The dispersant is adsorbed to the surfaces of the silver particles to form the silver colloid particles.

The dispersant acts to stabilize the colloid solution by allowing the silver colloid particles to be uniformly dispersed in the water-based dispersion medium (the colloid solution) under electrical repulsion forces of the COOH groups present in the dispersant.

If the total number of the COOH and OH groups contained in the dispersant is less than three, or if the number of the COOH groups is smaller than the number of the OH groups, there is a case that dispersibility of the silver colloid particles cannot be obtained sufficiently.

Examples of the dispersant include citric acid, malic acid, trisodium citrate, tripotassium citrate, trilithium citrate, triammonium citrate, disodium malate, tannic acid, Gallo tannic acid, Gallo tannin and the like, one or more of which may be used independently or in combination.

Further, the dispersant formed of a mercapto acid or a salt thereof having two or more COOH and SH groups in a total number is preferably used. The dispersant is adsorbed to the surfaces of the silver particles through mercapto groups thereof to form the silver colloid particles.

The dispersant also acts to stabilize the colloid solution by allowing the silver colloid particles to be uniformly dispersed in the water-based dispersion medium (the colloid solution) under electrical repulsion forces of the COOH groups present in the dispersant.

If the total number of the COOH and SH groups contained in the dispersant is less than two, that is, one of the COOH and SH groups is contained in the dispersant, there is a case that dispersibility of the silver colloid particles cannot be obtained sufficiently.

Examples of the dispersant include mercaptoacetic acid, mercaptopropionic acid, thiodipropionic acid, mercaptosuccinic acid, thioacetic acid, sodium mercaptoacetate, sodium mercaptopropionate, sodium thiodipropionate, disodium mercaptosuccinate, potassium mercaptoacate, potassium mercaptopropionate, potassium thiodipropionate, dipotassium mercaptosuccinate, and the like, one or more of which may be used independently or in combination.

An amount of the silver colloid particles contained in the ink (the colloid solution) is in the range of about 1 to 60 wt %, and more preferably in the range of about 10 to 45 wt %. If the amount of the silver colloid particles falls below the lower limit value noted above, an absolute amount of the silver contained in the ink becomes too small. As a result, there is a need to apply the ink several times when the conductive pattern is formed into a relatively thick film.

In contrast, if the amount of the silver colloid particles exceeds the upper limit value noted above, the amount of the silver colloid particles contained in the ink becomes too great unnecessarily, thus reducing dispersibility of the silver colloid particles. In order to avoid the dispersibility reduction, it is necessary to increase frequency of stirring the ink.

An average particle size of the silver colloid particles is preferably in the range of 1 to 100 nm, and more preferably in the range of 10 to 30 nm. This makes it possible to obtain an ink which can be ejected more stably, and to form a conductive pattern having a fine pattern with ease.

When the silver colloid particles are heated up to 500° C. in a thermogravimetric analysis, a heat loss of the silver colloid particles is preferably in the range of about 1 to 25 wt %. As the silver colloid particles (solid contents) are heated up to 500° C., the dispersant and the residual reducing agent described below are oxidatively decomposed and are gasified and eliminated for their most parts.

Since a quantity of the residual reducing agent seems to be insignificant, it may be conceived that the loss of the silver colloid particles when heated up to 500° C. corresponds substantially to a quantity of the dispersant present in the silver colloid particles.

If the loss-on-heating is smaller than 1 wt %, the quantity of the dispersant relative to that of the silver particles becomes too small, thus reducing dispersibility of the silver particles (the silver colloid particles). In contrast, if the loss-on-heating is greater than 25 wt %, the quantity of the residual dispersant relative to that of the silver particles becomes too great, consequently increasing specific resistance of the conductive pattern.

The specific resistance can be improved to a certain degree by heating and sintering the conductive pattern after formation thereof to decompose and eliminate organic components. Therefore, it is preferred that the ink of the present invention is used for forming the conductive pattern on a substrate which is sintered at a higher temperature, such as a ceramic substrate.

Further, an amount of the silver particles (which do not adsorb the dispersant) contained in the ink is in the range of 0.5 to 60 wt %, and more preferably in the range of 10 to 45 wt %. This makes it possible to more effectively prevent occurrence of disconnection of the conductive pattern. Therefore, it is possible to provide a conductive pattern having higher reliability.

In this regard, it is to be noted that a method of producing the silver colloid particles will be described below in detail.

Surface Tension Adjuster

It is preferred that the conductive pattern formation ink of the present invention contains a surface tension adjuster that adjusts surface tension of the ink.

By containing the surface tension adjuster in the ink, the surface tension of the ink can be adjusted. This makes it possible to more appropriately control an affinity of the ink to the surface of the ceramic molded body. Therefore, the liquid droplets landed on the surface can make close contact therewith and be prevented from spreading excessively thereon.

For these reasons, it is possible to form a fine and accurate conductive pattern. This makes it possible to easily obtain a conductive pattern particularly firmly making close contact with the surface of the ceramic molded body and having a predetermined shape and high reliability.

Such a surface tension adjuster is not particularly limited to a specific type, as long as it can adjust the surface tension of the conductive pattern formation ink to thereby provide the above property to the ink.

Meanwhile, in general, there is a problem in that a conventional surface tension adjuster forms micelles easily. Therefore, in the case where the conductive pattern formation ink contains the conventional surface tension adjuster, there is a fear that the micelles (micro-bubbles) each encapsulated into the silver colloid particles and/or air bubbles are formed so that dispersion stability of the silver colloid particles in the ink and ejection stability of the ink are inhibited.

Further, there is a case that the conventional surface tension adjuster cannot be distributed at a predetermined region of the ink (that is, a surface of each liquid droplet of the ink) due to the formation of the micelles. In this case, in order that the conventional surface tension adjuster exhibits its functions, the ink must contain a large amount thereof.

In contrast, the present inventors have found that by using a surface tension adjuster containing a compound represented by the following formula (I), affinity of the conductive pattern formation ink to the surface of the ceramic molded body can be appropriately adjusted.

The compound represented by the following formula (I) is apt to have relatively similar polarities at right-and-left end portions of a chemical structure thereof. Such a compound can form micelles hardly, as a result of which the surface tension adjuster containing the compound can adjust the surface tension of the ink effectively.

Specifically, the surface tension adjuster containing the compound can easily adjust the affinity of the conductive pattern formation ink to the surface of the ceramic molded body can be appropriately adjusted with a relatively small additive amount thereof.

Further, use of the surface tension adjuster containing the compound makes it possible to improve adhesiveness of the formed conductive pattern to the substrate (the ceramic substrate) into which the ceramic molded body is transformed.

In addition, since such a compound can form micelles hardly, even in the case where the ejected liquid droplets contain air bubbles, the use of the surface tension adjuster containing the compound makes it possible to rapidly remove the air bubbles therefrom.

Moreover, the use of the surface tension adjuster containing the compound makes it possible to appropriately adjust an affinity of the ink to an inner surface of the liquid droplet ejection head (e.g., an inner circumference surfaces of the ejection portions). This makes it possible to form liquid droplets each having a desired size. Even in the case where the ink needs to be continuously ejected for a long period of time, it can be stably ejected.

In addition, since the compound represented by the following formula (I) has a specific chemical structure, it can prevent aggregation and the like of the silver colloid particles. Therefore, even in the case where the ink contains a relatively large additive amount of the surface tension adjuster, it is possible to reliably prevent the inhibition of the dispersion stability of the silver colloid particles in the ink.

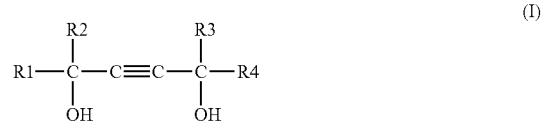

wherein each of R1, R2, R3 and R4 is independently a hydrogen atom or an alkyl group.

A weight average molecular weight of the compound represented by the above formula (I) is preferably in the range of 150 to 900, and more preferably in the range of 150 to 500.

This makes it possible to sufficiently enhance adhesiveness of the ink to the surface of the ceramic molded body, and to particularly improve the ejection stability of the ink with a relatively small additive amount of the surface tension adjuster.

This also makes it possible to improve the dispersion stability of the silver colloid particles (the metal colloid particles) in the conductive pattern formation ink. As a result, storage stability and reliability of the conductive pattern formation ink become particularly excellent.

Further, the number of carbon atoms contained in the compound represented by the above formula (I) is preferably in the range of 10 to 18, and more preferably in the range of 12 to 16.

This makes it possible to sufficiently enhance adhesiveness of the ink to the surface of the ceramic molded body, and to particularly improve the ejection stability of the ink with a relatively small additive amount of the surface tension adjuster.

This also makes it possible to improve the dispersion stability of the silver colloid particles (the metal colloid particles) in the conductive pattern formation ink. As a result, storage stability and reliability of the conductive pattern formation ink become particularly excellent.

It is preferred that in the above formula (I), the R1 and the R4 have the same chemical structure and the R2 and the R3 have the same chemical structure. In this case, it becomes particularly difficult that the compound represented by the above formula (I) forms the micelles.

This makes it possible to preferably prevent the generation of the air bubbles in the ink and to more easily remove the air bubbles contained in the ejected liquid droplets even if they are generated therein. As a result, it is possible to sufficiently enhance adhesiveness of the ink to the surface of the ceramic molded body, and to particularly improve the ejection stability of the liquid droplets of the ink with a relatively small additive amount of the surface tension adjuster.

This also makes it possible to improve the dispersion stability of the silver colloid particles (the metal colloid particles) in the conductive pattern formation ink. As a result, storage stability and reliability of the conductive pattern formation ink become particularly excellent.

In the above formula (I), preferably at least one of the R1 and the R4 is a branched alkyl group having the carbon atoms of 3 to 6, more preferably both the R1 and the R4 are the branched alkyl groups each having the carbon atoms of 3 to 6, and even more preferably at least one of the R1 and the R4 is an isopropyl group.

This makes it possible to sufficiently enhance adhesiveness of the ink to the surface of the ceramic molded body, and to particularly improve the ejection stability of the liquid droplets of the ink with a relatively small additive amount of the surface tension adjuster.

This also makes it possible to improve the dispersion stability of the silver colloid particles (the metal colloid particles) in the conductive pattern formation ink. As a result, storage stability and reliability of the conductive pattern formation ink become particularly excellent.

Further, in the above formula (I), preferably at least one of the R2 and the R3 is an alkyl group having the carbon atoms of 1 to 4, more preferably both the R2 and the R3 are alkyl groups each having the carbon atoms of 1 to 4, and even more preferably at least one of the R2 and the R3 is a methyl group.

This makes it possible to sufficiently enhance adhesiveness of the ink to the surface of the ceramic molded body, and to particularly improve the ejection stability of the liquid droplets of the ink with a relatively small additive amount of the surface tension adjuster.

This also makes it possible to improve the dispersion stability of the silver colloid particles (the metal colloid particles) in the conductive pattern formation ink. As a result, storage stability and reliability of the conductive pattern formation ink become particularly excellent.

In this regard, the surface tension adjuster is not limited to the above one containing the compound represented by the above formula (I), and may contain a compound represented by the following formula (III). The compound represented by the following formula (III) is preferably used as the surface tension adjuster because it has high solubility to the water-based dispersion medium.

Further, since the compound represented by the following formula (III) has a similar chemical structure to that of a polyether compound which will be described below, the compound represented by the following formula (III) has high affinity to the polyether compound.

Therefore, use of the surface tension adjuster containing the compound represented by the following formula (III) makes it possible to stably and appropriately dissolve and disperse the polyether compound in the water-based dispersion medium. As a result, even in the case where the conductive pattern formation ink contains a relatively large amount of the polyether compound, it is possible to easily adjust the viscosity of the ink to the above mentioned range.

Furthermore, it is difficult that the compound represented by the following formula (III) forms the micelles as is the case with the compound represented by the above formula (I).

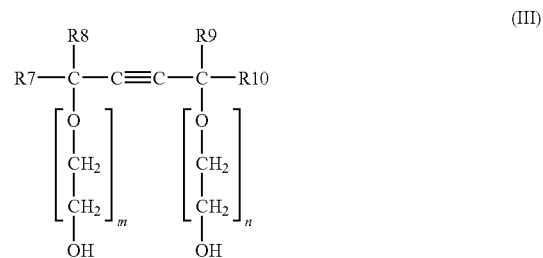

wherein each of R7, R8, R9 and R10 is independently a hydrogen atom or an alkyl group, and m+n is in the range of 1 to 30 in the number of moles of added ethylene oxide.

It is preferred that in the above formula (III), the R7 and the R10 have the same chemical structure and the R8 and the R9 have the same chemical structure.

This makes it possible to sufficiently enhance adhesiveness of the ink to the surface of the ceramic molded body, and to particularly improve the ejection stability of the liquid droplets of the ink with a relatively small additive amount of the surface tension adjuster.

In the above formula (III), preferably at least one of the R7 and the R10 is a branched alkyl group having the carbon atoms of 3 to 6, more preferably both the R7 and the R10 are branched alkyl groups each having the carbon atoms of 3 to 6, and even more preferably at least one of the R7 and the R10 is an isopropyl group.

This makes it possible to sufficiently enhance adhesiveness of the ink to the surface of the ceramic molded body, and to particularly improve the ejection stability of the liquid droplets of the ink with a relatively small additive amount of the surface tension adjuster.

Further, in the above formula (III), preferably at least one of the R8 and the R9 is an alkyl group having the carbon atoms of 1 to 4, more preferably both of the R8 and the R9 are alkyl groups each having the carbon atoms of 1 to 4, and even more preferably at least one of the R8 and the R9 is a methyl group.

This makes it possible to sufficiently enhance adhesiveness of the ink to the surface of the ceramic molded body, and to particularly improve the ejection stability of the liquid droplets of the ink with a relatively small additive amount of the surface tension adjuster.

A HLB value of the above mentioned surface tension adjuster is preferably in the range of 2 to 16, and more preferably in the range of 3 to 14.

This makes it possible to sufficiently enhance adhesiveness of the ink to the surface of the ceramic molded body, and to particularly improve the ejection stability of the liquid droplets of the ink with a relatively small additive amount of the surface tension adjuster.

This also makes it possible to improve the dispersion stability of the silver colloid particles in the conductive pattern formation ink. As a result, storage stability and reliability of the conductive pattern formation ink become particularly excellent.

It is preferred that the ink contains two or more kinds of the surface tension adjusters having different HLB values. This makes it possible to easily adjust balance between surface tension in a solid-liquid interface (that is, hydrophile-lipophile balance) and dispersibility of the silver colloid particles.

Further, in this case, the surface tension of the ink can be easily adjusted and the generation of the air bubbles can be more reliably prevented.

Especially, in the two or more kinds of the surface tension adjusters having the different HLB values, a HLB value difference between the surface tension adjuster having the highest HLB value and the surface tension adjuster having the lowest HLB value is preferably in the range of 4 to 12, and more preferably in the range of 5 to 10.

In this case, the surface tension of the ink can be easily adjusted and the generation of the air bubbles can be more reliably prevented with a relatively small additive amount of the surface tension adjuster.

In the case where the ink containing the two or more kinds of the surface tension adjusters is used, a HLB value of the surface tension adjuster having the highest HLB value is preferably in the range of 8 to 16, and more preferably in the range of 9 to 14. On the other hand, a HLB value of the surface tension adjuster having the lowest HLB value is preferably in the range of 2 to 7, and more preferably in the range of 3 to 5.

An amount of the surface tension adjuster contained in the ink is preferably in the range of 0.001 to 1 wt %, and more preferably in the range of 0.01 to 0.5 wt %.

This makes it possible to sufficiently enhance adhesiveness of the ink to the surface of the ceramic molded body, and to particularly improve the ejection stability of the liquid droplets of the ink with such a relatively small additive amount of the surface tension adjuster.

This also makes it possible to improve the adhesiveness of the formed conductive pattern to the substrate (the ceramic substrate). As a result, the reliability of the formed conductive pattern becomes particularly excellent.

Other Ingredients

The conductive pattern formation ink may contain a polyether compound in addition to the above ingredients. In the case where the ink contains such a polyether compound, it becomes possible to moderately adjust the viscosity of the ink. Therefore, the liquid droplets of the conductive pattern formation ink can be more stably ejected. Further, it is possible to prevent spread of the liquid droplets landed on the surface of the ceramic molded body. As a result, enlargement of diameters of them is prevented.

Further, the polyether compound has a function of preventing generation of cracks in a patterned film (that is, a pre-pattern which is transformed into the conductive pattern as described below) formed using the conductive pattern formation ink when drying the patterned film (namely, when removing the water-based dispersion medium from the pre-pattern).

The polyether compound can bind the silver colloid particles together and prevent them from being scattered, even if the ceramic molded body is expanded and contracted by a temperature change, the pre-pattern of the conductive pattern is shrunk when drying it, or the like. As a result, it becomes possible to prevent generation of cracks in the conductive pattern formed.

Examples of the polyether compound include a polyglycerin compound having a polyglycerin chemical structure such as polyglycerin or polyglycerin ester, polyethylene glycol, and the like, one or more of which may be used independently or in combination.

Use of such a polyether compound ensures that polymer chains exist between the silver colloid particles. This makes it possible to maintain an adequate distance between the silver colloid particles and to prevent them from aggregating together, whereby a large amount of the silver colloid particles can be stably dispersed in the ink.

In addition, since the ink containing the polyether compound can have an appropriate viscosity, it can be stably ejected from the ejection portions of the liquid droplet ejection head in an effective manner and a diameter of each of the liquid droplets thereof landed on the ceramic molded body can become enough small. Further such an ink can exhibit increased film-forming capability.

Further, the polyether compound has a relatively high boiling point. In a process of forming the conductive pattern with the conductive pattern formation ink, the polyether compound is evaporated or oxidatively decomposed after the water-based dispersion medium contained in the ink has been evaporated.

Therefore, a state that the silver colloid particles are covered with the polyether compound is maintained for a long period of time. This makes it possible to avoid any rapid volumetric shrinkage of the pre-pattern of the conductive pattern and any grain growth of the silver particles.

Among the compounds stated above, it is preferable to use the polyglycerin compound with the polyglycerin chemical structure, and more preferable to use the polyglycerin. This makes it possible to more moderately adjust the viscosity of the conductive pattern formation ink.

Further, use of the polyglycerin compound (particularly, the polyglycerin) makes it possible to more reliably prevent the generation of the cracks and also to make more prominent the effects mentioned above. The polyglycerin compound is also preferred because it exhibits increased solubility to the water-based dispersion medium (water).

Examples of the polyglycerin ester include polyglycerin monostearate, polyglycerin tristearate, polyglycerin tetrastearate, polyglycerin monooleate, polyglycerin pentaoleate, polyglycerin monolaurate, polyglycerin monocaprylate, polyglycerin polycyanurate, polyglycerin sesquistearate, polyglycerin decaoleate, polyglycerin sesquioleate, and the like, one or more of which may be used independently or in combination.

A weight average molecular weight of the polyglycerin compound used herein is preferably in the range of 300 to 3,000, more preferably in the range of 300 to 1,000, and even more preferably in the range of 400 to 600. This makes it possible to more reliably adjust the viscosity of the conductive pattern formation ink to an adequate range.

Further, this makes it possible to more reliably prevent the generation of the cracks when drying the pre-pattern of the conductive pattern (that is, the pattered film formed of the conductive pattern formation ink).

If the weight average molecular weight of the polyglycerin compound falls below the lower limit value noted above, the compound tends to be decomposed during a course of drying, which in turn reduces the effect of preventing the generation of the cracks.

If the weight average molecular weight of the polyglycerin compound exceeds the upper limit value noted above, dispersibility of the silver colloid particles in the ink (the colloid solution) is reduced by an excluded volume effect of the polyglycerin compound or the like.

Examples of the polyethylene glycol include polyethylene glycol #200 (having a weight average molecular weight of 200), polyethylene glycol #300 (having a weight average molecular weight of 300), polyethylene glycol #400 (having a weight average molecular weight of 400), polyethylene glycol #600 (having a weight average molecular weight of 600), polyethylene glycol #1,000 (having a weight average molecular weight of 1,000), polyethylene glycol #1,500 (having a weight average molecular weight of 1,500), polyethylene glycol #1,540 (having a weight average molecular weight of 1,540), polyethylene glycol #2,000 (having a weight average molecular weight of 2,000), and the like.

An amount of the polyether compound (particularly, the polyglycerin compound) contained in the ink is preferably in the range of 5 to 25 wt %, more preferably in the range of 5 to 22 wt %, and even more preferably in the range of 7 to 20 wt %. This makes it possible to more effectively prevent the generation of the cracks.

If the amount of the polyether compound is smaller than the lower limit value noted above, there is a case that the viscosity of the conductive pattern formation ink becomes excessively low, and the effect of preventing the generation of the cracks is reduced in the case where the weight average molecular weight thereof falls below the lower limit value noted above.

On the other hand, if the amount of the polyether compound is greater than the upper limit value noted above, dispersibility of the silver colloid particles in the ink (the colloid solution) is reduced in the case where the weight average molecular weight thereof exceeds the upper limit value noted above.

Further, the conductive pattern formation ink may contain a drying suppressant for suppressing drying of the ink in addition to the above ingredients. In the case where the ink contains such a drying suppressant, the following effects can be obtained.

Specifically, it is possible to suppress the water-based dispersion medium from evaporating in the vicinity of the ejection portions of the liquid droplet ejection head, even when an ejecting operation of the ink is stopped or the ink is ejected continuously for a long period of time.

This makes it possible to stably eject the conductive pattern formation ink from the liquid droplet ejection head.

As a result, it is possible to easily form a fine conductive pattern including wirings each having a uniform width. This conductive pattern can have high reliability.

As such a drying suppressant, a polyalcohol having two or more hydroxyl groups in a molecule thereof can be used. Use of the polyalcohol makes it possible to more effectively suppress the evaporation of the water-based dispersion medium (the drying of the dispersion solution) due to interaction (e.g., formation of hydrogen bonds, van der Waals bonds or the like) between the polyalcohol and the water-based dispersion medium.

As a result, it is possible to more effectively suppress the evaporation of the water-based dispersion medium in the vicinity of the ejection portions of the liquid droplet ejection head.

Furthermore, it is possible to easily remove the polyalcohol from the conductive pattern, for example, by decomposition thereof when forming the conductive pattern. Moreover, the use of the polyalcohol makes it possible to appropriately adjust the viscosity of the ink, thereby further improving film-forming capability thereof.

Examples of the polyalcohol include ethylene glycol, 1,3-butylene glycol, 1,3-propanediol, propylene glycol, various kinds of sugar alcohols obtained by reducing aldehyde groups and/or ketone groups included in chemical structures of sugars to the hydroxyl groups, and the like, one or more of which may be used independently or in combination.

Among them, it is preferred that the polyalcohol containing at least one kind of the sugar alcohols is used. This makes it possible to more reliably suppress the evaporation of the water-based dispersion medium in the vicinity of the ejection portions of the liquid droplet ejection head.

Further, this makes it possible to more easily remove the at least one kind of the sugar alcohols from the conductive pattern by oxidatively decomposing it when forming the conductive pattern through a sintering treatment.

Further, when the patterned film formed using the conductive pattern formation ink, that is, the pre-pattern before being transformed (changed) into the conductive pattern is dried (namely, the water-based dispersion medium is removed from the pre-pattern), the at least one of the sugar alcohols is precipitated in the pre-pattern due to the evaporation of the water-based dispersion medium therefrom.

This makes it possible to increase the viscosity of the conductive pattern formation ink constituting the pre-pattern. Therefore, it is possible to more reliably prevent the conductive pattern formation ink from diffusing toward an undesired region on the surface of the ceramic molded body. As a result, a conductive pattern having a desired shape can be formed with high accuracy.

Further, it is preferred that the polyalcohol containing two or more kinds of the sugar alcohols is used. This makes it possible to more reliably suppress the evaporation of the water-based dispersion medium in the vicinity of the ejection portions of the liquid droplet ejection head.

Examples of the sugar alcohol include threitol, erythritol, pentaerythritol, dipentaerythritol, tripentaerythritol, arabitol, ribitol, xylitol, sorbitol, mannitol, gulitol, talitol, galactitol, allitol, altritol, dolucitol, iditol, glycerin (glycerol), inositol, maltitol, isomaltitol, lactitol, turanitol and the like, one or more of which may be used independently or in combination.

Among them, the polyalcohol preferably contains at least one kind of the sugar alcohols selected from the group comprising the glycerin, the xylitol, the sorbitol, the erythritol, the maltitol, the mannitol, the galactitol, the inositol and the lactitol, and more preferably contains two or more kinds of the sugar alcohols selected from the above group. This makes it possible to enhance the above effect obtained by using the sugar alcohol as the drying suppressant.

In the case where the at least one of the sugar alcohols is contained in the drying suppressant, an amount thereof is preferably equal to or more than 15 wt %, more preferably equal to or more than 30 wt %, and even more preferably in the range of 40 to 70 wt %. This makes it possible to more reliably suppress the evaporation of the water-based dispersion medium in the vicinity of the ejection portions of the liquid droplet ejection head.

Further, it is preferred that the polyalcohol containing 1,3-propanediol is used. This makes it possible to more effectively suppress the evaporation of the water-based dispersion medium in the vicinity of the ejection portions of the liquid droplet ejection head, and to appropriately adjust the viscosity of the conductive pattern formation ink. Therefore, it becomes possible to more stably eject the conductive pattern formation ink from the ejection portions of the liquid droplet ejection head.

In the case where the 1,3-propanediol is contained in the drying suppressant, an amount thereof is preferably in the range of 10 to 60 wt %, and more preferably in the range of 30 to 50 wt %. This makes it possible to more stably eject the conductive pattern formation ink from the ejection portions of the liquid droplet ejection head.

An amount of the drying suppressant contained in the ink (the colloid solution) is preferably in the range of 5 to 20 wt %, and more preferably in the range of 8 to 15 wt %. This makes it possible to more effectively suppress the evaporation of the water-based dispersion medium in the vicinity of the ejection portions of the liquid droplet ejection head, thereby enabling to form a conductive pattern having a desired shape with high accuracy.

In contrast, if the amount of the drying suppressant contained in the ink is lower than the lower limit value noted above, there is a case that a suppression effect for suppressing the drying of the ink (the colloid solution) cannot be obtained sufficiently depending on a material constituting the drying suppressant.

On the other hand, if the amount of the drying suppressant contained in the ink exceeds the upper limit value noted above, the amount of the drying suppressant becomes excessively large as compared with that of the silver particles (the silver colloid particles). Therefore, in the case where the pre-pattern is sintered to obtain the conductive pattern, the drying suppressant is apt to remain in the conductive pattern.

This causes increase of specific resistance of the conductive pattern. In this regard, the specific resistance of the conductive pattern can be improved to a certain degree, by controlling sintering conditions such as a sintering time and a sintering atmosphere.

Further, the conductive pattern formation ink may contain a water-soluble polymer such as polyvinyl alcohol or the like. Examples of the polyvinyl alcohol include polyvinyl alcohol #200 (having a weight average molecular weight of 200), polyvinyl alcohol #300 (having a weight average molecular weight of 300), polyvinyl alcohol #400 (having a weight average molecular weight of 400), polyvinyl alcohol #600 (having a weight average molecular weight of 600), polyvinyl alcohol #1,000 (having a weight average molecular weight of 1,000), polyvinyl alcohol #1,500 (having a weight average molecular weight of 1,500), polyvinyl alcohol #1,540 (having a weight average molecular weight of 1,540), polyvinyl alcohol #2,000 (having a weight average molecular weight of 2,000), and the like, one or more of which may be used independently or in combination.

Constituent ingredients of the conductive pattern formation ink are not limited to the above ingredients, and may contain other ingredients than the above ingredients.

Although the silver colloid particles including the silver particles are dispersed in the ink (the colloid solution) according to the description made above, the colloid particles may include other metal particles than the silver particles. Examples of a metal constituting the other metal particles include copper, palladium, platinum, gold, alloy thereof, and the like, and one or more of which may be used independently or in combination.

In the case of using metal particles composed of the alloy, the alloy may contain the above mentioned metal as its major component, and other metals. Further, it may also be possible to use alloy obtained by mixing the above mentioned metals with each other in an arbitrary ratio. Mixed particles (e.g., combination of silver particles, copper particles and palladium particles mixed in an arbitrary ratio) may be dispersed in the ink (the colloid solution).

The above mentioned metals are low in resistivity and are stable such that they are not oxidized by a heat treatment. Therefore, use of these metals makes it possible to form a conductive pattern that exhibits low resistance and high stability.

Method of Producing Conductive Pattern Formation Ink

Next, one example of a method of producing the above conductive pattern formation ink will be described.

As described above, the ink is comprised of the colloid solution containing the silver colloid particles in which the dispersant is adsorbed on the surfaces of the silver particles. In this embodiment, the colloid solution is obtained by preparing an aqueous solution in which the dispersant and a reducing agent are dissolved, and then dropping an aqueous silver salt solution into the aqueous solution.

When the aqueous silver salt solution is dropped into the aqueous solution, $Ag^+$ ions derived from a silver salt contained in the aqueous silver salt solution are reduced by the reducing agent contained in the aqueous solution, so that the $Ag^+$ ions are transformed into silver atoms to produce the silver particles in the aqueous solution. Therefore, in this embodiment, the silver salt is a starting material for producing the silver particles.

In the method of producing the ink of this embodiment, first, the aqueous solution in which the above dispersant and reducing agent are dissolved is prepared.

The dispersant is blended preferably in such a blending quantity that a mole ratio of the dispersant to silver contained in the silver salt becomes equal to about 1:1 to 1:100. Examples of the silver salt, which is the starting material of the silver particles, include silver nitrate and the like.

If the mole ratio of the dispersant to the silver salt becomes greater, a particle size of each of the silver particles grows smaller and contact points between the silver particles are increased in the thus formed conductive pattern. This makes it possible to obtain a conductive pattern whose volume resistance value is low.

As described above, the reducing agent acts to generate the silver particles through a reduction of $Ag^+$ ions contained in the silver salt (the starting material) such as the silver nitrate ($Ag^+ NO^{3-}$) or the like.

The reducing agent is not particularly limited to a specific type. Examples of the reducing agent include: an amine-based reducing agent such as hydrazine, dimethylaminoethanol, methyldiethanolamine or triethanolamine; a hydrogen compound-based reducing agent such as sodium boron hydroxide, a hydrogen gas or hydrogen iodide; an oxide-based reducing agent such as carbon monoxide, sulfurous acid or hypophosphorous acid; a low-valent metal salt-based reducing agent such as a Fe (II) compound or a Sn (II) compound; an organic compound-based reducing agent such as sugar (e.g., D-glucose) or formaldehyde; a hydroxy acid, cited above as the dispersant, such as citric acid, malic acid or tannic acid; a hydroxy acid salt, cited above as the dispersant, such as trisodium citrate, tripotassium citrate, trilithium citrate, triammonium citrate or disodium malate; and the like. Among them, the hydroxy acid (including the tannic acid) or the salt thereof serve as both the reducing agent and the dispersant.

Further, the mercapto acid or the salt thereof, cited above as the dispersant, is preferably used as the reducing agent. This is because the mercapto acid or the salt thereof can be bonded to surfaces of the silver particles (the metal particles) stably.

Examples of the mercapto acid include mercaptoacetic acid, mercaptopropionic acid, thiodipropionic acid, mercaptosuccinic acid and thioacetic acid. On the other hand, examples of the mercapto acid salt include sodium mercaptoacetate, sodium mercaptopropionate, sodium thiodipropionate, disodium mercaptosuccinate, potassium mercaptoacate, potassium mercaptopropionate, potassium thiodipropionate and dipotassium mercaptosuccinate.

These reducing agents and dispersants may be used independently or in combination. When using these compounds, it may be possible to accelerate a reducing reaction by applying light or heat thereto.

The reducing agent is blended in such a blending quantity as to completely reduce the silver salt which is the starting material of the silver particles. If the blending quantity is excessive, the reducing agent remains in the colloid solution (an aqueous silver colloid solution) as impurities, which may be a cause of adversely affecting conductivity of the formed conductive pattern.

This means that the blending quantity should preferably be a smallest possible quantity. More specifically, the blending quantity is such that a mole ration of the silver salt to the reducing agent becomes equal to about 1:1 to 1:3.

In this embodiment, it is preferred that, after the aqueous solution is prepared by dissolving the dispersant and the reducing agent in the solvent, pH of the aqueous solution is adjusted to 6 to 10.

The reason is as follows. For example, in the case of mixing the trisodium citrate as the dispersant and ferrous sulfate as the reducing agent, the pH of the aqueous solution becomes equal to about 4 to 5 depending on an overall concentration thereof, which falls below the pH 6 mentioned above.

At this time, equilibrium of a reaction represented by the following reaction equation (1) is shifted to the right side by hydrogen ions existing in the aqueous solution, thereby increasing a quantity of the COOH groups.

$$—COO^- + H^+ \rightarrow —COOH \qquad (1)$$

This reduces electrical repulsion forces of the surfaces of the silver particles obtained by subsequently dropping the aqueous silver salt solution, which leads to reduction in dispersibility of the silver particles (the silver colloid particles).

For this reason, after the aqueous solution has been prepared by dissolving the dispersant and the reducing agent in the solvent, an alkaline compound is added to the aqueous solution to reduce a hydrogen ion concentration thereof.

The alkaline compound added at this time is not particularly limited to a specific type. Examples of the alkaline compound include sodium hydroxide, potassium hydroxide, lithium hydroxide, ammonia water and the like. Among them, it is preferable to use the sodium hydroxide that can easily adjust the pH with a small amount thereof.

In this regard, addition of the alkaline compound in a quantity great enough to increase the pH of the aqueous solution to more than 10 is undesirable, because the hydroxide of ions of a residual reducing agent (that is, a residue of the reducing agent) such as iron ions or the like is apt to precipitate.

Next, in the method of producing the ink of this embodiment, the aqueous silver salt solution containing the silver salt is dropped into the aqueous solution in which the dispersant and the reducing agent are dissolved.

The silver salt is not particularly limited to a specific type. Examples of the silver salt include silver acetate, silver carbonate, silver oxide, silver sulfate, silver nitrite, silver chlorate, silver sulfide, silver chromate, silver nitrate, silver dichromate and the like. Among them, it is preferable to use the silver nitrate that exhibits high water-solubility.

A quantity of the silver salt is decided by taking into account a target amount of the silver colloid particles and a percentage of the silver salt reduced by the reducing agent. In the case of the silver nitrate, about 15 to 70 mass parts of the silver nitrate is used on the basis of 100 mass parts of the aqueous silver salt solution.

The aqueous silver salt solution is prepared by dissolving the silver salt in pure water and is gradually dropped into the aqueous solution in which the dispersant and the reducing agent are dissolved.

As described above, in this step, the $Ag^+$ ions contained in the silver salt is reduced by the reducing agent so that the $Ag^+$ ions are transformed into silver atoms to produce the silver particles in the aqueous solution. At this time, the dispersant is adsorbed to the surfaces of the silver particles to form the silver colloid particles.

This produces an aqueous solution in which the silver colloid particles are dispersed in a colloidal form, that is, the colloid solution.

In addition to the silver colloid particles, the residual reducing agent and the dispersant are likely to exist in the thus obtained colloid solution as ions. Thus, an ion concentration of the colloid solution as a whole becomes high.

In the colloid solution of this state, the silver particles are aggregated to produce aggregates and the aggregates are easily precipitated. For this reason, it is preferred that cleaning is performed to remove superfluous ions of the residual reducing agent and dispersant present in the colloid solution and to reduce the ion concentration thereof.

Cleaning methods include: a method of repeating several times the steps of leaving the colloid solution containing the silver colloid particles at rest for a specified time, removing supernatant liquid thus created, adding pure water to the colloid solution, stirring the colloid solution, leaving the colloid solution at rest for a specified time and removing supernatant liquid thus created; a method of performing centrifugal separation in place of leaving the colloid solution at rest; a method of removing ions by ultrafiltration; and the like.

Further, the following method may be used. In this method, first, after the colloid solution is produced, the pH thereof is adjusted to an acidic area of 5 or lower so that the above reaction equation (1) is shifted to the right side, thereby positively aggregating the silver colloid particles (the metal colloid particles) due to reduction of the electrical repulsion forces of the surfaces of the silver particles. Next, in this aggregated state of the silver colloid particles, the cleaning is performed so that salts and the solvent are removed from the colloid solution.

In this regard, in the case where a sulfur compound having a low molecular weight such as the mercapto acid is used as the dispersant, such a sulfur compound forms stable bonds to the surfaces of the silver particles (the metal particles) to produce the silver colloid particles (the metal colloid particles). Therefore, by adjusting the pH of the colloid solution to an alkaline area of 6 or higher once again, the aggregated silver colloid particles are re-dispersed therein with ease. In this way, it is possible to obtain a colloid solution having excellent dispersion stability.

In the method of producing the ink of this embodiment, it is preferred that, at the end of the above step, the pH of the colloid solution, in which the silver colloid particles are dispersed, is finally adjusted to 6 through 11 by adding, if necessary, an aqueous alkali metal hydroxide solution to the colloid solution.

Due to the cleaning performed after reduction, a concentration of sodium ions as electrolytic ions is sometimes decreased. With the colloid solution of this state, equilibrium of a reaction represented by the following reaction equation (2) is shifted to the right side.

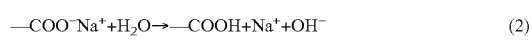

$$—COO^-Na^+ + H_2O \rightarrow —COOH + Na^+ + OH^- \qquad (2)$$

In this case, the silver colloid particles (that is, the silver particles) exhibit a decrease in their electrical repulsion forces and suffer from a reduction in the dispersibility thereof. For this reason, the equilibrium of the reaction equation (2) is shifted to the left side and the silver colloid particles are stabilized by adding an appropriate amount of alkali metal hydroxide.

The alkali metal hydroxide used at this time includes, e.g., the same compound as used in first adjusting the pH of the above aqueous solution. If the pH is lower than 6, the equilibrium of the reaction equation (2) is shifted to the right side, consequently making the silver colloid particles unstable.

In contrast, if the pH is higher than 11, precipitation of hydroxide salt of residual ions such as iron ions is apt to occur, which is undesirable. In the case where the iron ions or the like are removed in advance, no big problem is posed even when the pH is higher than 11.

It is preferred that positive ions such as sodium ions are added in the form of hydroxide. This makes it possible to use self-protolysis of water. Therefore, this is the most effective way of adding the positive ions such as sodium ions to the colloid solution.

Next, the above other ingredients including the surface tension adjuster and the like are added to the colloid solution produced in this way. Thereafter, the colloid solution to which the other ingredients have been added is subjected to a degassing treatment, to thereby obtain a conductive pattern formation ink (the conductive pattern formation ink of the present invention).

A method for performing the degassing treatment is not particularly limited to a specific type. Examples of such a method include a gas replacement method, a heating method, a vacuum method, an ultrasonic method, a gas permeable membrane method, and the like. Among them, it is preferable to use the gas permeable membrane method because the method can be performed continuously and is suitable for mass-producing the conductive pattern formation ink.

In addition, use of the gas permeable membrane method makes it possible to reliably degas the colloid solution (the ink), while preventing a change of a composition of the ink, and to maintain the amount of the gas molecules (the oxygen and nitrogen molecules) dissolved in the degassed ink to a lower level for a very long period of time. Further, it is preferable to use the vacuum method because the method can be performed easily.

In this regard, since the oxygen and nitrogen molecules are contained (dissolved) in not the silver colloid particles but the water-based dispersion medium, the measurement of the total amount of the oxygen and nitrogen molecules is performed on the water-based dispersion medium using the above gas chromatography method.

In this regard, an addition timing of the other ingredients including the surface tension adjuster and the like to the colloid solution is not limited to a specific point of time. Namely, they may be added to the colloid solution at any time after formation of the silver colloid particles.

Further, the above surface tension adjuster(s) may be added to the colloid solution by mixing the surface tension adjuster(s) with a dispersant, that improves dispersibility thereof in the colloid solution, to prepare a dispersion liquid, and then adding the dispersion liquid to the colloid solution. As such a dispersant, the above mentioned polyalcohol can be used.

Conductive Pattern

Next, description will be given on a conductive pattern of this embodiment. The conductive pattern is a thin-film type conductive pattern formed using the above conductive pattern formation ink so that the silver particles can be bonded together.

At least on a surface of the conductive pattern, the silver particles are bonded to one another without leaving any gap therebetween. The conductive pattern has specific resistance of less than 20 $\mu\Omega$cm.

Especially, since this conductive pattern is formed by ejecting the conductive pattern formation ink of the present invention using the liquid droplet ejecting method, it can have high adhesiveness to the ceramic substrate, high reliability and fine size.

The specific resistance of the conductive pattern is preferably smaller than 20 $\mu\Omega$cm, and more preferably 15 $\mu\Omega$cm or less. If the specific resistance is equal to or greater than 20 $\mu\Omega$cm, it is difficult to use the conductive pattern in a conductivity-requiring application, e.g., in an electrode formed on a circuit substrate.

Wiring Substrate

Next, a wiring substrate according to the present invention will be described.

FIG. 1 is a longitudinal section view showing one example of a wiring substrate according to the present invention (a ceramic circuit substrate).

As shown in FIG. 1, the wiring substrate (the ceramic circuit substrate) 1 includes a laminated substrate 3, which is formed by laminating a plurality of (e.g., about ten through twenty) ceramic substrates 2, and a circuit 4 formed on one outermost layer, i.e., one end surface, of the laminated substrate 3, the circuit 4 being made of fine wirings and the like.

The laminated substrate 3 includes a plurality of circuits (the conductive patterns) 5 formed by the conductive pattern formation ink of the present invention and arranged between the ceramic substrates (ceramic sintered bodies) 2.

Contacts (vias) 6 that make contact with circuits 5 are formed in the circuits 5. With this configuration, the circuits 5 arranged one above another are conducted through the contacts 6. Just like the circuits 5, the circuit 4 is formed by the conductive pattern formation ink of the present invention.

The wiring substrate 1 of the present invention constitutes an electronic component to be used in various kinds of electronic equipments. The wiring substrate 1 may be provided with a laminated ceramic condenser, a laminated inductor, an LC filter and a composite high-frequency component in addition to the circuits 4 and 5 including various kinds of wirings, electrodes and the like.

Further, such a wiring substrate 1 can be used in high-frequency modules, interposers, micro-electromechanical systems, acceleration sensors, acoustic surface wave devices, antennas, odd-shaped electrodes (including comb electrodes) of mobile communication equipments such as a cellular phone, a PDA or the like, and electronic components of various kinds of measuring instruments.

Since the circuits (the conductive patterns) 4 and 5 of such a wiring substrate 1 is produced using the conductive pattern formation ink of the present invention, they can have excellent reliability and be electrically connected together at arbitrary desired portions in a reliable manner.

Further, even in the case where the circuits 4 and 5 are formed so as to have a fine pattern in the wiring substrate 1, they can have excellent reliability. The above circuits (the conductive patterns) 4 and 5 and wiring substrate 1 provided with such circuits 4 and 5 can be produced using the above conductive pattern formation ink by means of the following method.

Method of Producing Conductive Pattern and Wiring Substrate

Next, description will be made on one example of a method of producing the circuits (the conductive patterns) 4 and 5 using the conductive pattern formation ink and the wiring substrate 1 provided with the circuits 4 and 5 (the ceramic substrate).

Figure 2:
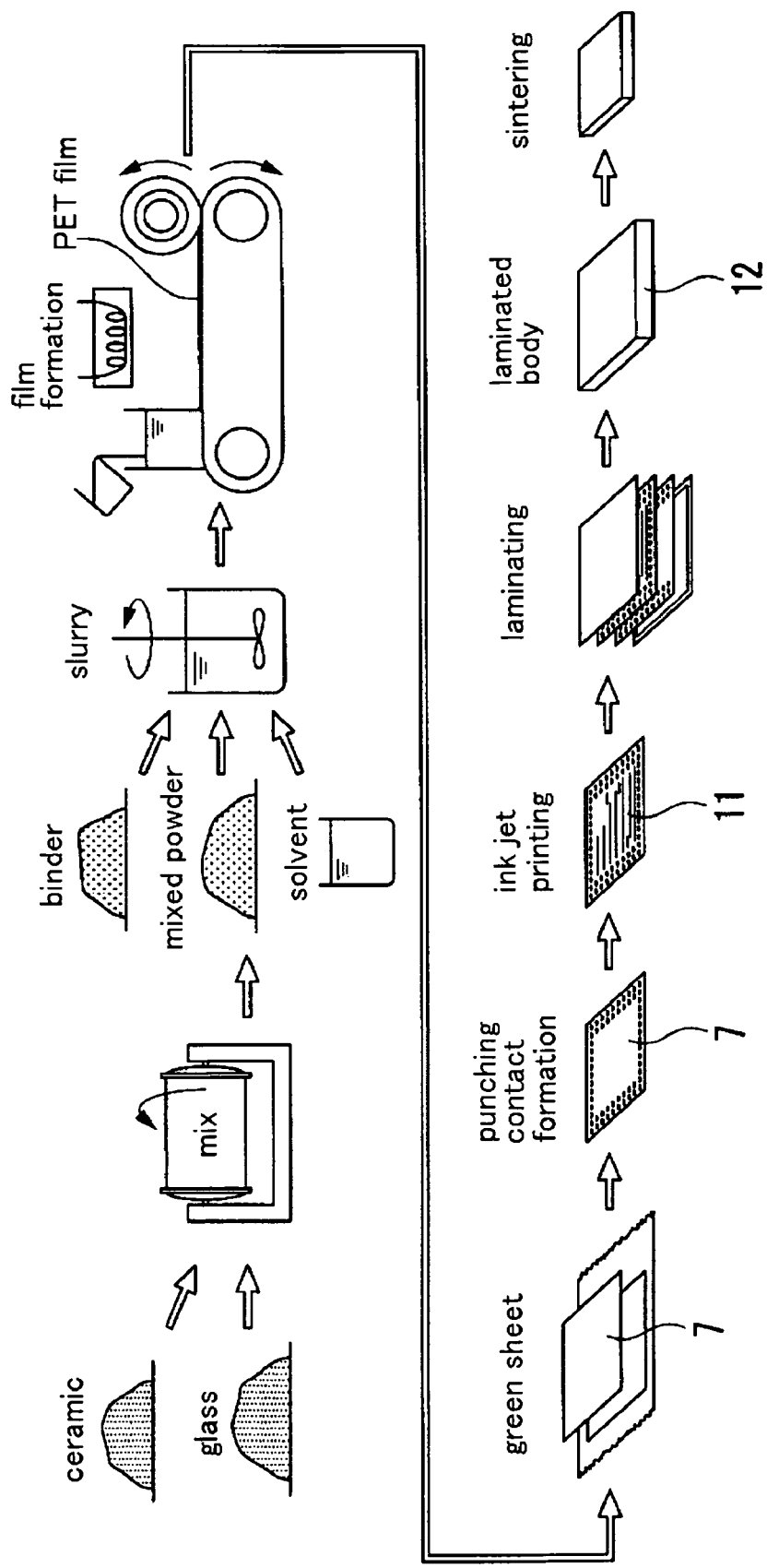
FIG. 2 is an explanatory view schematically illustrating the steps of a method of producing the wiring substrate (the ceramic circuit substrate) shown in FIG. 1.
Figure 3A:
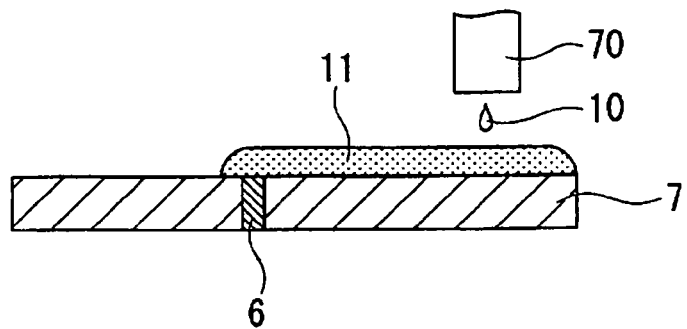
FIGS. 3A and 3B are views for explaining a production process of the wiring substrate (the ceramic circuit substrate) shown in FIG. 1.
Figure 3B:
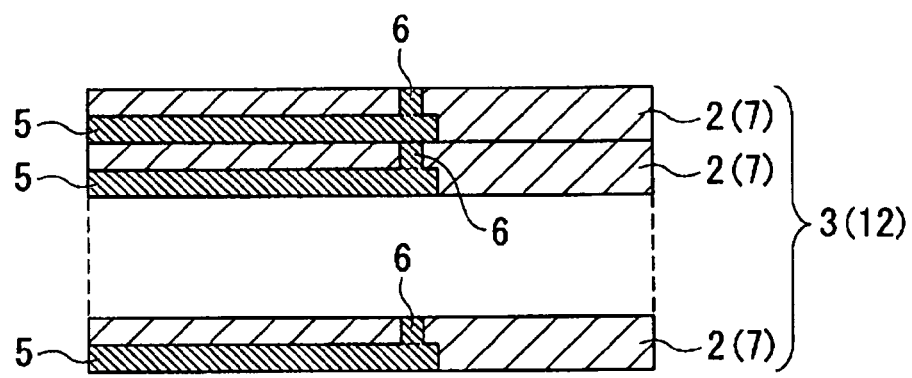

FIG. 2 is an explanatory view schematically illustrating the steps of a method of producing the wiring substrate (the ceramic circuit substrate) shown in FIG. 1. FIGS. 3A and 3B are views for explaining a production process of the wiring substrate (the ceramic circuit substrate) shown in FIG. 1.

Figure 4:
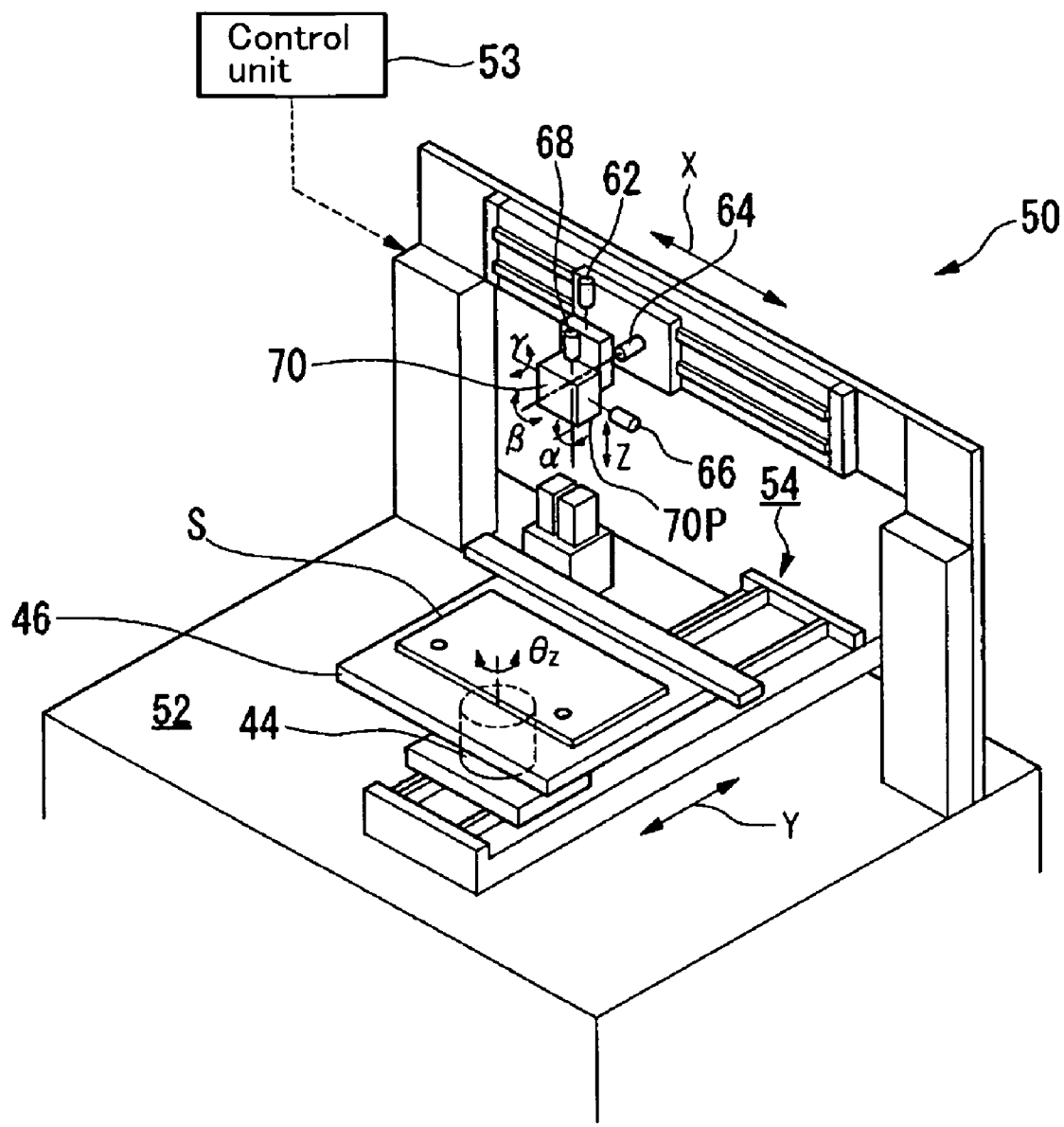
FIG. 4 is a perspective view showing a schematic configuration of an ink jet apparatus (a liquid droplet ejection apparatus).
Figure 5:
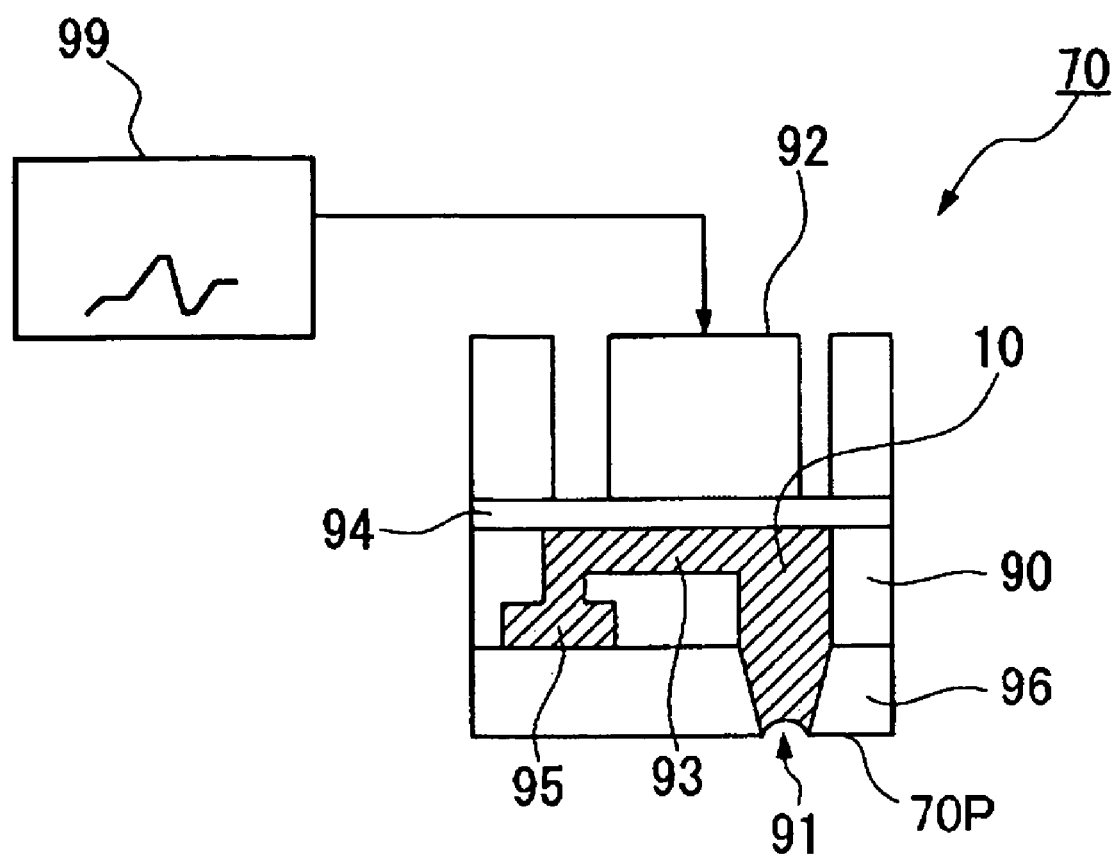
FIG. 5 is a pattern diagram for explaining a schematic configuration of an ink jet head (a liquid droplet election head).

FIG. 4 is a perspective view showing a schematic configuration of an ink jet apparatus (a liquid droplet ejection apparatus). FIG. 5 is a pattern diagram for explaining a schematic configuration of an ink jet head (a liquid droplet election head).

The method of producing the conductive pattern of the present invention includes a step (an ink application step) of forming the pre-pattern of the conductive pattern by applying the ink on the surface of the ceramic molded body using the liquid droplet ejecting method, a step (a drying step) of removing the water-based dispersion medium from the pre-pattern, and a step (a sintering step) of sintering the pre-pattern to thereby obtain the conductive pattern.

The method of producing the wiring substrate 1 of this embodiment includes a step of preparing the ceramic molded bodies, a step (an ink application step) of forming the pre-patterns of the circuits 4 and 5 by applying the ink on the surfaces of the ceramic molded bodies using the liquid droplet ejecting method, a step (a drying step) of removing the water-based dispersion medium from the pre-patterns, a step of laminating the predetermined number of the ceramic molded bodies each having the pre-pattern together to obtain a laminated body, and a step (a sintering step) of sintering the laminated body provided with the pre-patterns to thereby obtain the wiring substrate 1 provided with the circuits 4 and 5.

Hereinafter, the respective steps will be described in detail.

First, ceramic powder composed of alumina ($Al_2O_3$) particles and titanium oxide ($TiO_2$) particles having an average particle size of about 1 to 2 μm, and glass powder composed of boron silicate glass particles having an average particle size of about 1 to 2 μm are prepared as raw powder.

The ceramic powder and the glass powder are mixed with each other in an appropriate mixing ratio, e.g., in a weight ratio of 1:1 to obtain a mixed powder.

Next, slurry is obtained by adding a suitable binder, a plasticizer, an organic solvent (a dispersant) and the like to the mixed powder, and then mixing and stirring the same. In this regard, it is to be noted that polyvinyl butyral is preferably used as the binder.

In the case where the ink contains the compound represented by the formula (I) as the surface tension adjuster, the polyvinyl butyral has high affinity to the compound represented by the formula (I). As a result, the ink can exhibit an appropriate affinity to the ceramic molded bodies each containing the polyvinyl butyral. Therefore, the ink can have an appropriate contact angle with respect to the surface of each ceramic molded body.

Further, the polyvinyl butyral is water-insoluble and is apt to be dissolved or swollen in what is called an oil-based organic solvent.

Then, the slurry thus obtained is coated on a PET film in a sheet shape using a doctor blade, a reverse coater or the like. Depending on production conditions of an article, the slurry is formed into a sheet having a thickness of several micrometers to several hundred micrometers, and then the sheet is wound into a roll.

Subsequently, the roll is severed in conformity with use of the article and is cut into a sheet having a specified size. In this embodiment, the roll is cut into, e.g., a square sheet whose one side has a length of 200 mm to obtain sheet-like ceramic molded bodies (that is, ceramic green sheets) 7.

If necessary, through-holes are formed in given positions by punching (processing) each ceramic green sheet 7 with a $CO_2$ laser, a YAG laser, a mechanical punch or the like. A thick-film conductive paste in which metal particles are dispersed is filled into the through-holes to form portions which will be transformed into the contacts 6.

Further, portions which will be transformed into terminal portions (not shown) are formed in the given positions of predetermined ceramic green sheets 7 by screen printing the thick-film conductive paste. In this way, the ceramic green sheets 7, on which the portions which will be transformed into the contacts 6 and/or the terminal portions are formed, are obtained.

In this regard, it is to be noted that the conductive pattern formation ink of the present invention can be used as the thick-film conductive paste.

Next, the pre-pattern 11 which will be transformed into the circuit 5 is formed on an upper surface (one surface) of the ceramic green sheet 7 in such a state that the pre-pattern 11 continuously extends from the portions which will be transformed into the contacts 6. This step is the ink application step.

In other words, as illustrated in FIG. 3A, the conductive pattern formation ink 10 (hereinafter, simply referred to as "ink 10") described above is applied on the upper surface of the ceramic green sheet 7 using the liquid droplet ejecting method (the ink jet method), thereby forming the pre-pattern 11.

In this embodiment, application of the ink 10 on the upper surface of the ceramic green sheet 7 can be performed using, for example, an ink jet apparatus (a liquid droplet ejection apparatus) 50 shown in FIG. 4, and an ink jet head (a liquid droplet ejection head) 70 shown in FIG. 5.

Hereinafter, the ink jet apparatus 50 and the ink jet head 70 will be described in detail.

FIG. 4 is a perspective view showing the ink jet apparatus 50. Referring to FIG. 4, the left-and-right direction of a base 52 is designated by a X direction, the back-and-forth direction is designated by a Y direction, and the vertical direction is designated by a Z direction.

The ink jet apparatus 50 includes the ink jet head 70 (hereinafter, simply referred to as "head 70") and a table 46 for supporting a substrate S (the ceramic green sheet 7 in this embodiment). An operation of the ink jet apparatus 50 is controlled by means of a control unit 53.

The table 46 for supporting the substrate S can be moved and positioned in the Y direction by means of a first moving means 54 and can be swung and positioned in a θz direction by means of a motor 44.

On the other hand, the head 70 can be moved and positioned in the X direction by means of a second moving means (not shown) and can be moved and positioned in the Z direction by means of a linear motor 62. Furthermore, the head 70 can be swung and positioned in α, β and γ directions by means of motors 64, 66 and 68, respectively.

Based on this configuration, the ink jet apparatus 50 is capable of accurately controlling a relative position and posture between an ejection surface 70P of the head 70 and a surface of the substrate S placed on the table 46.

A rubber heater (not shown) is arranged on a rear surface (a lower surface) of the table 46. The upper surface of the ceramic green sheet 7 placed on the table 46 as a whole is heated up to a specified temperature by means of the rubber heater.

At least a part of the water-based dispersion medium is evaporated from a surface side of each liquid droplet of the ink 10 landed on the upper surface of the ceramic green sheet 7. At this time, evaporation of the water-based dispersion medium is accelerated because the ceramic green sheet 7 remains in a heated state.

Each liquid droplet landed on the one surface of the ceramic green sheet 7 is thickened first in a peripheral edge of the surface thereof. That is to say, the peripheral edge of the surface of each liquid droplet begins to be thickened because an amount (a concentration) of solid contents (the silver colloid particles) in a peripheral portion becomes higher than in a central portion more rapidly.

The peripheral portion of each liquid droplet thus thickened stops its spreading action along a plane direction of the upper surface of the ceramic green sheet 7. This makes it easy to control a diameter of each liquid droplet landed on the upper surface of the ceramic green sheet 7 and hence a line width of each wiring constituting the circuit 5.

A heating temperature of the ceramic green sheet 7 is not particularly limited to a specific value. Specifically, the heating temperature is preferably in the range of 40 to 100° C., and more preferably in the range of 50 to 70° C. By setting the heating temperature to the above range, it is possible to more reliably prevent the spread of each liquid droplet landed. This makes it possible to reliably control the diameter of each liquid droplet landed and hence the line width of each wiring.

Meanwhile, if a temperature of water becomes higher, saturated amounts (concentrations) of the oxygen and nitrogen molecules to the water are lowered. Therefore, in the case where a temperature of the ink becomes high, the oxygen and nitrogen molecules are difficult to be dissolved in the water-based dispersion medium so that they are gasified to thereby generate air bubbles.

From this viewpoint, the amounts of the oxygen and nitrogen molecules contained (dissolved) in the water-based dispersion medium of the ink need to be further decreased in anticipation of a temperature rise of the liquid droplet ejection head.

In the case where the ink is ejected under the above heating environment (namely, in a state that the ceramic green sheet 7 is heated), there is a case that the temperature of the liquid droplet ejection head becomes 35° C. or higher.

At this time, in order to prevent the generation of the air bubbles in the ink, the total amount of the oxygen and nitrogen molecules dissolved in the water-based dispersion medium needs to be adjusted to a range equal to or less than a total saturated amount (that is, 18 ppm) at 35° C. of the oxygen and nitrogen molecules.

Further, in order to produce a large quantity of products, an industrial liquid droplet ejection apparatus must be able to eject the great number of liquid droplets continuously for a long period of time. Therefore, since the temperature of the liquid droplet ejection head becomes higher, the total amount of the oxygen and nitrogen molecules dissolved in the water-based dispersion medium must be further decreased.

In a hypothetical case that the temperature of the liquid droplet ejection head raises up to the above heating temperature (that is, 70 to 100° C.), the total amount of the oxygen and nitrogen molecules dissolved in the water-based dispersion medium needs to be adjusted to a range of 12 ppm or less.

In other words, by setting the total amount of the oxygen and nitrogen molecules dissolved in the water-based dispersion medium of the ink to the range of 12 ppm or less, it is possible to obtain an ink in which the air bubbles are hardly generated, even in the case where the ink is ejected under the heating environment.

As shown in FIG. 5, the head 70 is designed to eject the ink 10 from a nozzle (the liquid droplet ejection portion) 91 according to an ink jet system (a liquid droplet ejecting system).

The liquid droplet ejecting system may be any technique known in the art, including a piezo system in which the ink 10 is ejected using a piezo element made of a piezoelectric body and a bubble system in which the ink is ejected using bubbles generated when heating the ink 10.

Among them, the piezo system is advantageous in that it does not heat the ink 10 and therefore does not affect a composition of materials used. For this reason, the head 70 shown in FIG. 5 employs the piezo system.

The head 70 includes a head main body 90 having a reservoir 95 formed therein and a plurality of ink chambers 93 branched from the reservoir 95. The reservoir 95 serves as a flow path through which the ink 10 is supplied to the respective ink chambers 93.

A nozzle plate 96 is mounted to a lower surface of the head main body 90. A plurality of nozzles 91 for ejecting the ink 10 are provided in the nozzle plate 96 in a corresponding relationship with the respective ink chambers 93. An outer surface (a lower surface in FIG. 5) of the nozzle plate 96 is an ejection surface 70P on which the nozzles 91 open. Ink flow paths are formed to extend from the respective ink chambers 93 toward the corresponding nozzles 91.

On the other hand, a vibration plate 94 is mounted to an upper surface of the head main body 90. The vibration plate 94 constitutes wall surfaces of the respective ink chambers 93. Piezo elements 92 are provided outside the vibration plate 94 in a corresponding relationship with the respective ink chambers 93.

Each of the piezo elements 92 is formed of a piezoelectric material such as quartz or the like and a pair of electrodes (not shown) for holding the piezoelectric material therebetween. The electrodes are connected to a driving circuit 99.

The nozzle plate 96 includes a base member made of stainless steel, a silica film provided so as to cover the base member and mainly constituted from a silica compound, and a liquid repellency film provided so as to cover the silica film and containing a fluoroalkyl silane compound.

In the case where the nozzle plate 96 has the liquid repellency film containing the fluoroalkyl silane compound on a surface side thereof, it is possible to moderately control affinity of the ink 10 to the ejection surface 70P of the nozzle plate 96.

This makes it possible to more appropriately improve the fluid cut of the ink 10 in each nozzle 91 and to particularly easily adjust an amount of each liquid droplet of the ink 10. Further, by providing the liquid repellency film in the nozzle plate 96, it can have particularly excellent abrasion resistance and weather resistance.

The above silica film has a function of improving adhesiveness between the liquid repellency film and the base member made of the stainless steel, and a function of protecting the base member made of the stainless steel. For this reason, the head 70 (the ink jet apparatus 50) provided with such a nozzle plate 96 can exhibit particularly excellent ejection stability of the liquid droplets of the ink 10 for a long period of time.

If an electrical signal is inputted to the piezo elements 92 from the driving circuit 99, the piezo elements 92 undergo dilation deformation or shrinkage deformation. As the piezo elements 92 undergo shrinkage deformation, pressure of the ink chambers 93 is decreased and the ink 10 is admitted into the ink chambers 93 from the reservoir 95.

As the piezo elements 92 undergo dilation deformation, the pressure of the ink chambers 93 is increased and the ink 10 is ejected from the nozzles 91. A deformation amount of the piezo elements 92 can be controlled by changing a voltage applied thereto.

Furthermore, a deformation speed of the piezo elements 92 can be controlled by changing a frequency of the voltage applied thereto. In other words, ejection conditions of the ink 10 can be controlled by adjusting conditions of the voltage applied to the piezo elements 92.

Accordingly, use of the ink jet apparatus 50 having the head 70 stated above makes it possible to accurately eject and deliver the ink 10 to a desired place of the upper surface of the ceramic green sheet 7 in a desired quantity. Particularly, since the ink 10 is the conductive pattern formation ink of the present invention, the above effect can be obtained remarkably. Therefore, it is possible to accurately and easily form the pre-pattern 11 as shown in FIG. 3A.

When forming the conductive pattern, it is possible to provide a thick conductive pattern by repeatedly performing the steps of applying the ink 10 to form a film, preliminarily heating the film to evaporate the water-based dispersion medium therefrom, and applying once again the ink 10 on the preliminarily heated film.

In the case where the ink 10 contains the above polyether compound, the polyether compound and the silver colloid particles are left (remain) in the ink 10 from which the water-based dispersion medium has been evaporated. Since the polyether compound has a relatively high viscosity, there is no possibility that the film (the pre-pattern) thus formed by the ink 10 may be washed away (diffused) even when it is not fully dried. Therefore, it becomes possible to apply the ink 10 once again after the ink 10 is first applied, dried and left at rest for a long period of time.

Furthermore, since the above polyether compound has a relatively high boiling point, there is also no possibility that the ink 10 constituting the film (the pre-pattern) may undergo a change in quality even when the ink 10 is applied, dried and left at rest for a long period of time. It also becomes possible to apply the ink 10 once again, which makes it possible to form the film (the pre-pattern) with a uniform quality.

This eliminates possibility that the conductive pattern may become a multi-layer structure, which would lead to an increase in inter-layer specific resistance and, eventually, an increase in specific resistance of the conductive pattern as a whole.

By going through the above-noted steps, the conductive pattern can be formed thicker than a conductive pattern produced by a conventional ink. More specifically, it is possible to form a conductive pattern whose thickness is equal to or greater than 5 μm.

Since such a conductive pattern is formed by the aforementioned ink, cracks are seldom generated even when the conductive pattern is formed into a thickness of 5 μm or more. This makes it possible to construct a conductive pattern with reduced specific resistance.

There is no need to particularly restrict an upper limit of the thickness of the conductive pattern. However, if the thickness of the conductive pattern is too great, difficulties may be encountered in removing the water-based dispersion medium and the polyether compound, which may possibly increase the specific resistance of the conductive pattern. For this reason, it is preferred that the conductive pattern has a thickness of about 100 μm or less.

Next, the water-based dispersion medium is removed from the pre-pattern 11 formed on the ceramic green sheet 7. This step is the drying step.

A drying temperature of the pre-pattern 11 is preferably in the range of 40 to 100° C., and more preferably in the range of 50 to 70° C. By adjusting the drying temperature to the above range, it is possible to prevent the generation of the cracks in the dried pre-patterns 11.

Once the pre-pattern 11 is formed in the above manner, the same steps are repeated to form the required number of, e.g., about ten to twenty, the ceramic green sheets 7 each having the pre-pattern 11 which will be transformed into the circuit 5. Further, the ceramic green sheet 7 having the pre-pattern 11 which will be transformed into the circuit 4 is formed.

Then, the PET film is peeled off from each of the ceramic green sheets 7, and the ceramic green sheets 7 are laminated as illustrated in FIG. 2. At this time, the ceramic green sheets 7 are arranged so that, if necessary, the pre-patterns 11 of the ceramic green sheets 7 laminated one above another can be connected through the portions which will be transformed into the contacts 6.

Thereafter, the ceramic green sheets 7 are compressed and heated at a temperature equal to or higher than a glass transition temperature of the binder contained therein. In this way, a laminated body 12 is obtained.

The thus formed laminated body 12 is heated by use of, e.g., a belt type furnace. Namely the laminated body 12 is subjected to a sintering treatment. This step is the sintering step. As a result, the ceramic substrates 2 are obtained by firing the respective ceramic green sheets 7 as shown in FIG. 3B.

As the silver colloid particles forming the pre-patterns 11, including the silver particles (the metal particles), are sintered, the pre-patterns 11 are transformed into the circuits (the conductive patterns) 4 and 5 consisting of a wiring pattern or an electrode pattern. Further, at this time, the portions are also transformed into the contacts 6 and the terminal portions, respectively.

In this way, by subjecting the laminated body 12 to the heat treatment (the sintering treatment) as mentioned above, the laminated body 12 is transformed into the laminated substrate 3 shown in FIG. 1.

In this regard, a heating temperature of the laminated body 12 is preferably equal to or more than a softening point of the glass component (the glass powder) contained in the ceramic green sheets 7. More specifically, it is preferred that the heating temperature is in the range of 600 to 900° C.

Heating conditions are selected to make sure that the temperature is elevated and dropped at a suitable speed. Furthermore, the laminated body 12 is maintained for a suitable period of time at a maximum heating temperature, i.e., at the temperature of 600 to 900° C.

The glass component (the glass powder) of the ceramic substrates 2 thus obtained can be softened by elevating the heating temperature up to a temperature above the softening point of the glass component, i.e., the temperature range noted above.

Therefore, if the laminated body 12 is subsequently cooled down to normal temperature so that the glass component can be hardened, the respective ceramic substrates 2 that constitute the laminated substrate 3 are firmly bonded to the circuits (the conductive patterns) 4 and 5.

The ceramic substrates 2 obtained by heating the laminated body 12 up to the temperature range noted above become what is called low temperature co-fired ceramic (LTCC) which means the ceramic fired at a temperature of 900° C. or less.

Here, the silver particles (the metal particles) present in the ink 10 (the pre-pattern 11) delivered on each ceramic green sheet 7 are fused and continuously joined to one another. As a result, it is possible for the formed circuits (conductive patterns) 4 and 5 to exhibit conductivity.

By the heat treatment (the sintering treatment) noted above, the circuits 4 and 5 are formed to make direct contact with and come into connection with the contacts 6 of the ceramic substrates 2. In a hypothetical case that the circuits 4 and 5 are merely placed on the ceramic substrates 2, no mechanical connection strength would be secured between the circuits 4 and 5 and the ceramic substrates 2. Therefore, the circuits 4 and 5 may be possibly destroyed by shocks or the like.

In this embodiment, however, the circuits 4 and 5 are firmly fixed to the ceramic substrates 2 by first softening and then hardening the glass component contained in the ceramic green sheets 7. As a result, the formed circuits 4 and 5 can have high mechanical strength.

As described above, by subjecting the laminated body 12 to such a heat treatment (a sintering treatment), the circuit 4 can be formed simultaneously with the circuits 5, thereby producing the wiring substrate (the ceramic circuit substrate) 1.

In the method of producing the wiring substrate 1 mentioned above, particularly when producing the respective ceramic substrates 2 of which the laminated substrate 3 is formed, the above-mentioned ink 10 (that is, the conductive pattern formation ink of the present invention) is delivered to the upper surface of each ceramic green sheet 7.

This ensures that the conductive pattern formation ink 10 is appropriately delivered on the upper surface of each ceramic green sheet 7 in a required pattern. As a result, it is possible to form circuits (conductive patterns) 4 and 5 with high dimensional accuracy.

In this regard, it is to be noted that the pre-patterns 11 and the ceramic green sheets 7 may be independently sintered. In this case, the sintering treatment of the pre-patterns 11 can be carried out at 160° C. or higher for 20 minutes or longer. By doing so, the pre-patterns 11 are transformed into the circuits 4 and 5. Further, in this case, after the circuits 4 and 5 have been obtained, the ceramic green sheets 7 are transformed into the ceramic substrates 2 by subjecting them to the sintering treatment.

While the certain preferred embodiments of the present invention have been described hereinabove, the present invention is not limited thereto. Although the colloid solution is used in the foregoing embodiments as the dispersion solution prepared by dispersing the metal particles in the water-based dispersion medium, the dispersion solution may not be the colloid solution.

EXAMPLES

Hereinafter, the present invention will be described in more detail by virtue of examples. However, the present invention is not limited to these examples.

[1] Preparation of Conductive Pattern Formation Ink

In each of Examples and Comparative Examples, a conductive pattern formation ink was prepared as follows.

Example 1

17 g of trisodium citrate dihydrate and 0.36 g of tannic acid were dissolved in 50 mL of water alkalified by adding 3 mL of an aqueous 10N NaOH solution thereto, to obtain an aqueous solution. 3 mL of an aqueous 3.87 mol/L silver nitrate solution was added to the aqueous solution thus obtained drop by drop.

A silver colloid solution was obtained by stirring the above aqueous solution for two hours. The silver colloid solution thus obtained was dialyzed until conductivity thereof was decreased to 30 µS/cm or less, thereby desalting the silver colloid solution.

At the end of dialysis, coarse silver colloid particles were removed from the silver colloid solution by performing centrifugal separation at 3,000 rpm for 10 minutes.

Thereafter, a compound represented by the following formula (IV) as a surface tension adjuster, xylitol as a drying suppressant and a polyglycerin having a weight average molecular weight of 500 as a polyether compound were added to the silver colloid solution.

Next, ion-exchanged water was added to the silver colloid solution to adjust amounts (contents) of the above ingredients contained therein as shown in Table 1 to obtain a mixture solution. The mixture solution was degassed using a vacuum method in which it was left at room temperature for about 10 minutes in a reduced atmosphere of 400 Pa.

In this way, a conductive pattern formation ink was obtained. In this regard, it is to be noted that a HLB value of the surface tension adjuster was 4.

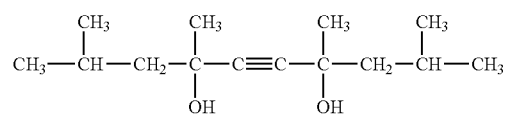

(IV)

Examples 2 to 5

In each of Examples 2 to 5, a conductive pattern formation ink was prepared in the same manner as in the Example 1 except that the amount of the surface tension adjuster was changed as shown in Table 1.

Example 6

A conductive pattern formation ink was prepared in the same manner as in the Example 1 except that the surface tension adjuster was changed from the compound represented by the above formula (IV) to a compound represented by the following formula (VI). In this regard, it is to be noted that a HLB value of the surface tension adjuster was 8.

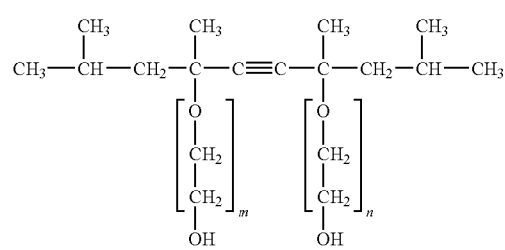

(VI)

wherein m+n was 3.5

Example 7

A conductive pattern formation ink was prepared in the same manner as in the Example 1 except that the surface tension adjuster was changed from the compound represented by the above formula (IV) to a compound represented by the following formula (VII). In this regard, it is to be noted that a HLB value of the surface tension adjuster was 4.

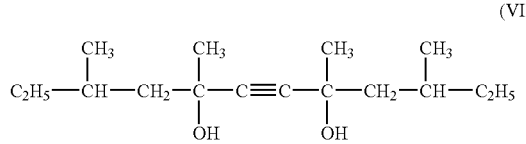

Example 8

A conductive pattern formation ink was prepared in the same manner as in the Example 1 except that the surface tension adjuster was changed from the compound represented by the above formula (IV) to combination of the compound represented by the above formula (IV) and the compound represented by the above formula (VI), and the amounts thereof were adjusted as shown in Table 1.

Example 9

A conductive pattern formation ink was prepared in the same manner as in the Example 1 except that the drying suppressant was changed from the xylitol to combination of the xylitol and 1,3-propanediol, and the amounts thereof were adjusted as shown in Table 1.

Example 10

A conductive pattern formation ink was prepared in the same manner as in the Example 1 except that the drying suppressant was changed from the xylitol to combination of the xylitol and maltitol, and the amounts thereof were adjusted as shown in Table 1.

Example 11

17 g of trisodium citrate dihydrate and 0.36 g of tannic acid were dissolved in 50 mL of water alkalified by adding 3 mL of an aqueous 10N NaOH solution thereto, to obtain an aqueous solution. 3 mL of an aqueous 3.87 mol/L silver nitrate solution was added to the aqueous solution thus obtained drop by drop.

A silver colloid solution was obtained by stirring the above aqueous solution for two hours. The silver colloid solution thus obtained was dialyzed until conductivity thereof was decreased to 30 μS/cm or less, thereby desalting the silver colloid solution.

At the end of dialysis, coarse silver colloid particles were removed from the silver colloid solution by performing centrifugal separation at 3,000 rpm for 10 minutes.

Thereafter, SURFYNOL 104PG-50, OLFINE EXP.4036, xylitol as a drying suppressant and polyglycerin as a polyether compound were added to the silver colloid solution.

Next, ion-exchanged water was added to the silver colloid solution to adjust amounts (contents) of the above ingredients contained therein as shown in Table 1 to obtain a mixture solution. The mixture solution was degassed using a vacuum method in which it was left at room temperature for about 10 minutes in a reduced atmosphere of 400 Pa. In this way, a conductive pattern formation ink was obtained.

In this regard, the SURFYNOL 104PG-50 was a product name of Nissin Chemical Industry Co., Ltd., and contained 50 wt % of the compound represented by the above formula (I) whose HLB value was 4 as the surface tension adjuster and 50 wt % of propylene glycol.

Further, the OLFINE EXP.4036 was a product name of Nissin Chemical Industry Co., Ltd., and contained 80 wt % of the compound represented by the above formula (I) whose HLB value was 13 as the surface tension adjuster.

In Table 1, the amount of the compound represented by the above formula (I), which is the surface tension adjuster contained in each of the SURFYNOL 104PG-50 and OLFINE EXP.4036, is shown in a column of the amount of the surface tension adjuster.

Example 12

A conductive pattern formation ink was prepared in the same manner as in the Example 11 except that the mixture solution was degassed using a vacuum method in which it was left at room temperature for about 10 minutes in a reduced atmosphere of 800 Pa.

Comparative Example 1

A conductive pattern formation ink was prepared in the same manner as in the Example 1 except that mixture solution was not degassed.

Comparative Examples 2

A conductive pattern formation ink was prepared in the same manner as in the Example 1 except that the mixture solution was degassed using a vacuum method in which it was left at room temperature for about 5 minutes in a reduced atmosphere of 1,000 Pa so that amounts of the oxygen and nitrogen molecules are, respectively, as shown in Table 2.

In Table 1, the ingredients contained in each of the conductive pattern formation ink obtained in the Examples 1 to and the Comparative Examples 1 to 2, and the amounts thereof contained in each ink are shown.

TABLE 1

| | amount of silver colloid particles [wt %] | surface tension adjuster | | | | | |
|---|---|---|---|---|---|---|---|
| | | kind | amount [wt %] | HLB value | kind | amount [wt %] | HLB value |
| Ex. 1 | 40 | formula(IV) | 0.03 | 4 | — | — | — |
| Ex. 2 | 40 | formula(IV) | 0.02 | 4 | — | — | — |
| Ex. 3 | 40 | formula(IV) | 0.05 | 4 | — | — | — |
| Ex. 4 | 40 | formula(IV) | 0.1 | 4 | — | — | — |
| Ex. 5 | 40 | formula(IV) | 0.2 | 4 | — | — | — |

TABLE 1-continued

| | | | | | | | |
|---|---|---|---|---|---|---|---|
| Ex. 6 | 40 | formula(VI) | 0.03 | 8 | — | — | — |
| Ex. 7 | 40 | formula(VII) | 0.03 | 4 | — | — | — |
| Ex. 8 | 40 | formula(IV) | 0.015 | 4 | formula(VI) | 0.005 | 8 |
| Ex. 9 | 40 | formula(IV) | 0.03 | 4 | — | — | — |
| Ex. 10 | 40 | formula(IV) | 0.03 | 4 | — | — | — |
| Ex. 11 | 40 | SURFYNOL | 0.02 | 4 | OLFINE | 0.005 | 13 |
| Ex. 12 | 40 | SURFYNOL | 0.02 | 4 | OLFINE | 0.005 | 13 |
| Comp. Ex. 1 | 40 | — | — | — | — | — | — |
| Comp. Ex. 2 | 40 | formula(IV) | 0.03 | 4 | — | — | — |

| | polyether compound | | drying suppressant | | | | amount of |
|---|---|---|---|---|---|---|---|
| | kind | amount [wt %] | kind | amount [wt %] | kind | amount [wt %] | water [wt %] |
| Ex. 1 | polyglycerin | 9 | xylitol | 6 | — | — | 44.97 |
| Ex. 2 | polyglycerin | 9 | xylitol | 6 | — | — | 44.98 |
| Ex. 3 | polyglycerin | 9 | xylitol | 6 | — | — | 44.95 |
| Ex. 4 | polyglycerin | 9 | xylitol | 6 | — | — | 44.9 |
| Ex. 5 | polyglycerin | 9 | xylitol | 6 | — | — | 44.8 |
| Ex. 6 | polyglycerin | 9 | xylitol | 6 | — | — | 44.97 |
| Ex. 7 | polyethylene glycol | 9 | xylitol | 6 | — | — | 44.97 |
| Ex. 8 | polyglycerin | 9 | xylitol | 6 | — | — | 44.98 |
| Ex. 9 | polyglycerin | 9 | xylitol | 6 | 1,3-propandiol | 5 | 39.97 |
| Ex. 10 | polyglycerin | 9 | xylitol | 6 | maltitol | 1 | 43.97 |
| Ex. 11 | polyglycerin | 9 | xylitol | 6 | propylene glycol | 5 | 39.975 |
| Ex. 12 | polyglycerin | 9 | xylitol | 6 | propylene glycol | 5 | 39.975 |
| Comp. Ex. 1 | polyglycerin | 9 | xylitol | 6 | — | — | 45 |
| Comp. Ex. 2 | polyglycerin | 9 | xylitol | 6 | — | — | 44.97 |

[2] Evaluation of Stability of Ejection Amounts of Liquid Droplets

An ink jet apparatus provided with an ink jet head as shown in FIGS. 4 and 5 and the conductive pattern formation inks of the Examples 1 to 12 and the Comparative Examples 1 to 2 were prepared. Driving waveforms of piezo elements was optimized, and then each of the conductive pattern formation inks was loaded to the ink jet apparatus.

Next, 10,000 of liquid droplets of each of the conductive pattern formation inks of the Examples 1 to 12 and the Comparative Examples 1 to 2 were continuously ejected from the respective nozzles of the ink jet head under an environment having a temperature of 35° C. and a humidity of 60% RH. A total weight of the ejected liquid droplets was measured for arbitrary two nozzles of the ink jet head, respectively.

Thereafter, an average ejection amount of the liquid droplets was calculated for the two nozzles, respectively, and an absolute value of a difference between the average ejection amounts was obtained. Next, the absolute value is defined as $\Delta W$ (ng) and a desired ejection amount of one liquid droplet is defined as $W_T$ (ng), a ratio of the $\Delta W$ to the $W_T$ (that is, $\Delta W/W_T$) was calculated.

Based on the calculated value of the $\Delta W/W_T$, the stability of the ejection amounts of the liquid droplets was evaluated according to criteria described below. In this regard, a smaller value of the $\Delta W/W_T$ means that the stability of the ejection amounts of the liquid droplets is superior.

A: the value of the $\Delta W/W_T$ was lower than 0.025.

B: the value of the $\Delta W/W_T$ was 0.025 or higher but lower than 0.625.

C: the value of the $\Delta W/W_T$ was 0.625 or higher.

[3] Evaluation of Clogging

A continuous ejection property of each of the conductive pattern formation inks of the Examples 1 to 12 and the Comparative Examples 1 to 2 was checked using an ink jet apparatus provided with an ink jet head as shown in FIGS. 4 and 5.

A weight of one liquid droplet was adjusted to 15 ng by optimizing driving waveforms of piezo elements, and then each of the conductive pattern formation inks was continuously ejected for 24 hours under an environment in which a temperature thereof was 25° C. and a humidity thereof 50%.

After each of the conductive pattern formation inks was continuously ejected, whether nozzles of the inkjet head were clogged or not was checked. Then, a rate of occurrence of the clogging of the nozzles, that is, [(the number of the nozzles clogged)/(the total number of the nozzles)]×100 was calculated.

Thereafter, the nozzles clogged were cleaned using a cleaning member made of a plastic material, whether the clogging could be eliminated or not was checked. These results were evaluated according to criteria described below.

A: the clogging of the nozzles did not occur.

B: the rate of the occurrence of the clogging of the nozzles was lower than 0.5% (but did not include 0%), and the clogging of the nozzles could be eliminated.

C: the rate of the occurrence of the clogging of the nozzles was 0.5% or higher but lower than 1.0%, and the clogging of the nozzles could be eliminated.

D: the rate of the occurrence of the clogging of the nozzles was 1.0% or higher, or the clogging of the nozzles could not be eliminated.

[4] Production of Ceramic Green Sheet

A ceramic green sheet was produced in the following manner. Ceramic powder composed of alumina ($Al_2O_3$) particles and titanium oxide ($TiO_2$) particles having an average particle size of about 1 to 2 μm, and glass powder composed of boron silicate glass particles having an average particle size of about 1 to 2 μm were mixed with each other in a weight ratio of 1:1.

Polyvinyl butyral as a binder and dibutyl phthalate as a plasticizer were added to the ceramic powder and the glass powder to obtain a mixture. Slurry was obtained by mixing and stirring the mixture. The slurry thus obtained was coated on a PET film in a sheet shape using a doctor blade, to produce a ceramic green sheet. The ceramic green sheet was cut into square sheets whose one side had a length of 200 mm.

[5] Production and Evaluation of Wiring Substrate

Using the conductive pattern formation inks of the Examples 1 to 12 and the Comparative Examples 1 to 2, wiring substrates were formed. In this regard, it is to be noted that 20 wiring substrates were formed for each of the conductive pattern formation inks. Each of the wiring substrates was formed as follows.

Ink Application Step

First, each of the conductive pattern formation inks was loaded to an ink jet apparatus provided with an ink jet head as shown in FIGS. 4 and 5. Then, the ceramic green sheet was heated to 60° C. and maintained at that temperature.

Liquid droplets each having a volume of 15 ng were sequentially ejected on a surface of the ceramic green sheet from the respective nozzles to form 20 line-shaped pre-patterns (which would be transformed into metal wirings) each having a line width of 50 μm, a thickness of 15 μm and a length of 10.0 cm.

Drying Step

Next, the ceramic green sheet having the line-shaped pre-patterns was put into a drying furnace in which the ceramic green sheet was heated, and the line-shaped pre-patterns were dried at 60° C. for 30 minutes.

The ceramic green sheet on which the line-shaped pre-patterns were formed in the above manner was referred to as a first ceramic green sheet. In this regard, 20 first ceramic green sheets were formed for each of the conductive pattern formation inks.

Next, whether cracks are generated in the respective ceramic green sheets or not were checked. In this regard, it is to be noted that the number of accepted first ceramic green sheets each having line-shaped pre-patterns in which the cracks were generated is shown in Table 2.

Next, 40 through-holes each having a diameter of 100 μm were formed by a mechanical punch on another ceramic green sheet in positions corresponding to opposite ends of the line-shaped pre-patterns. The conductive pattern formation ink was filled into the 40 through-holes to form cylindrical portions which would be transformed into contacts (vias).

Using the conductive pattern formation ink, square patterns of 2 mm in side length were formed on the cylindrical portions using the ink jet apparatus. These square patterns would be transformed into terminal portions.

The ceramic green sheet on which the square patterns were formed in the above manner was referred to as a second ceramic green sheet. In this regard, 20 second ceramic green sheets were formed for each of the conductive pattern formation inks.

Next, a green laminated body was obtained by laminating the first ceramic green sheet below the second ceramic green sheet and then laminating two raw ceramic green sheets therebelow as reinforcing layers. In this regard, 20 green laminated bodies were formed for each of the conductive pattern formation inks.

Sintering Step

Subsequently, the green laminated body was pressed at a temperature of 95° C. under a pressure of 250 kg/cm$^2$ for 30 seconds. Thereafter, the green laminated body was fired in an air atmosphere, according to a firing profile having a temperature elevation process in which the green laminated body was continuously heated for about 6 hours at a heating speed of 66° C./hour, for about 5 hours at a heating speed of 10° C./hour and for about 4 hours at a heating speed of 85° C./hour, and a temperature constant process in which the green laminated body was maintained for 30 minutes at a maximum temperature of 890° C.

By doing so, the line-shaped pre-patterns were transformed in to the metal wirings, the cylindrical portions were transformed into the contacts, the square patterns were transformed into the terminal portions, and the ceramic green sheets were transformed into the ceramic substrates. In this way, the wiring substrate was obtained.

After the wiring substrate had been cooled, a tester was attached between a pair of the terminal portions connected to the 20 metal wirings, in order to confirm whether the respective metal wirings were disconnected or not. Thereafter, conductivity percentage was calculated.

This result of confirmation are collectively shown in Table 2. In this regard, it is to be noted that the term "conductivity percentage" shows a value calculated by dividing the number of accepted metal wirings which are not disconnected by the total number of the metal wirings.

A: the conductivity percentages of all 20 wiring substrates were 100%.

B: among the 20 wiring substrates, the conductivity percentages of some wiring substrates were 100%, and the conductivity percentages of the other wiring substrates were 95% or more (namely, the practical use was possible).

C: the conductivity percentages of all 20 wiring substrates were less than 100% (namely, the practical use was impossible).

Adhesiveness of Conductive Pattern to Ceramic Substrate

Adhesiveness of a conductive pattern, which was formed using each of the conductive pattern formation inks of the Examples 1 to 12 and the Comparative Examples 1 to 2, to a ceramic substrate was evaluated as follows.

200 of lines each having a line width of 50 μm, a thickness of 15 μm and a length of 10.0 cm were drawn on a surface of the ceramic green sheet so as not to distance using each of the conductive pattern formation inks by means of the ink jet method (the liquid droplet ejecting method), to thereby form a film (a pre-pattern of a conductive pattern).

Thereafter, the ceramic green sheet with the film is degreased and sintered through the same sintering step as employed in the production of the wiring substrate, to thereby obtain a ceramic substrate with a conductive pattern.

The adhesiveness of the conductive pattern to the ceramic substrate was evaluated using a crosscut method pursuant to JIS K 5600. In this regard, the evaluation was carried out according to criteria described below.

A: a whole of a region zoned using a cutter blade was not peeled off from the ceramic substrate.

B: micro portions along edges of the region were peeled off from the ceramic substrate.

C: a number of portions within the region were peeled off from the ceramic substrate.

D: a whole of the region was peeled off from the ceramic substrate.

These results are collectively shown in Table 2. A viscosity of each conductive pattern formation ink at 25° C. measured using an oscillating type viscosity meter pursuant to JIS Z 8809 is shown in a column of "viscosity" of Table 2.

Further, a surface tension of each conductive pattern formation ink at 25° C. measured using a surface tension meter ("FACE CBVP-Z" which was a product name of KYOWA INTERFACE SCIENCE CO., LTD.) is shown in a column of "surface tension" of Table 2.

Furthermore, amounts of gas molecules (oxygen molecules and nitrogen molecules) contained in each conductive pattern formation ink, from which the silver colloid particles had been removed, were measured using a gas chromatography method. These measured values are shown in Table 2.

TABLE 2

|  | viscosity [mPa·s] | surface tension [dyn/cm] | amount | | stability of ejection amounts of liquid droplets | clogging | number of accepted first ceramic green sheets | conductivity evaluation | adhesiveness |
|---|---|---|---|---|---|---|---|---|---|
|  |  |  | oxygen molecules [ppm] | nitrogen molecules [ppm] |  |  |  |  |  |
| Ex. 1 | 6.4 | 36.5 | 1.7 | 5.8 | A | A | 20 | A | B |
| Ex. 2 | 5.8 | 37.7 | 2.5 | 6.1 | B | B | 17 | B | C |
| Ex. 3 | 5.9 | 35.3 | 1.9 | 5.5 | A | A | 20 | A | B |
| Ex. 4 | 6.4 | 28.9 | 1.3 | 4.3 | A | A | 20 | A | A |
| Ex. 5 | 6.2 | 25.9 | 0.9 | 4.1 | A | A | 20 | B | A |
| Ex. 6 | 6.3 | 38.0 | 2.1 | 5.6 | A | B | 18 | B | B |
| Ex. 7 | 6.0 | 29.8 | 1.8 | 5.1 | A | A | 20 | A | B |
| Ex. 8 | 5.9 | 29.4 | 1.9 | 4.3 | A | A | 20 | A | A |
| Ex. 9 | 6.4 | 35.9 | 0.8 | 5.8 | A | B | 19 | B | B |
| Ex. 10 | 5.8 | 35.8 | 1.5 | 5.1 | A | A | 20 | A | B |
| Ex. 11 | 5.9 | 36.1 | 1.9 | 5.6 | A | B | 20 | A | C |
| Ex. 12 | 5.9 | 35.9 | 2.8 | 7.1 | B | C | 15 | B | C |
| Comp. Ex. 1 | 6.0 | 56.1 | 6.0 | 11.3 | C | D | 5 | C | D |
| Comp. Ex. 2 | 6.4 | 36.5 | 4.6 | 8.7 | C | D | 4 | C | B |

As shown in Table 2, each of the conductive pattern formation inks of the present invention could be stably ejected. Further, the metal wirings (the conductive patterns) formed using each of the conductive pattern formation inks of the present invention had high adhesiveness to the ceramic substrate and particularly excellent reliability. On the other hand, satisfactory results were not obtained in the Comparative Examples.

Further, when liquid droplets each having a volume of 10 pL were ejected on the surface of the ceramic green sheet (the ceramic molded body) using each of the conductive pattern formation inks of the Examples, diameters of all liquid droplets landed on the surface of the ceramic green sheet were in the range of 30 to 50 μm. As a result, a very fine conductive pattern could be formed.

Furthermore, when the first ceramic green sheets were produced, each conductive pattern formation ink was applied on the surfaces of the ceramic green sheets by setting the temperatures of the ceramic green sheets to 20, 40, 70, 100 and 120° C., respectively. Thereafter, the same evaluations as described above were carried out. As a result, the same results as described above were obtained.

Especially, in the case where the temperature of each of the ceramic green sheets was set to a range of 40 to 100° C., each of the conductive patterns formed using the conductive pattern formation inks of the Examples had a fine shape, particularly higher adhesiveness to the surface of the ceramic substrate and particularly excellent reliability.

It is conceived that these results are obtained by combination of an effect in that diameters of the liquid droplets of each of the inks of the Examples can be controlled particularly easily by setting the temperature of the ceramic green sheet to the above range and an effect in that each of the inks can be stably ejected under such an environment.

Further, the same results as those noted above were attained in the case where the amount of the silver colloid particles contained in each of the conductive pattern formation inks was changed to 20 wt % and 30 wt %.

Furthermore, the same results as those noted above were also attained in the case where each of the conductive pattern formation inks is degassed using a gas permeable membrane method.

What is claimed is:

1. A conductive pattern formation ink for forming a conductive pattern by ejecting the ink in the form of liquid droplets on a surface of a ceramic molded body using a liquid droplet ejecting method, the ceramic molded body being made of a material containing ceramic particles and a binder, the ink comprising:

a water-based dispersion medium;

metal particles dispersed in the water-based dispersion medium; and a polyglycerin dispersed in the water-based dispersion medium, the polyglycerin having a weight average molecular weight in the range of 300 to 3,000, wherein the water-based dispersion medium contains oxygen molecules and nitrogen molecules, and wherein when the water-based dispersion medium is analyzed using a gas chromatography method, a total amount of the oxygen and nitrogen molecules contained in the water-based dispersion medium is 12 ppm or less, wherein each of the metal particles has a dispersant adsorbed on the metal particle, the dispersant constituted of a hydroxyl acid or a salt thereof, and the hydroxyl acid and the salt each having three or more COOH and OH groups in a total number, and wherein a number of the COOH groups is equal to or greater than a number of the OH groups.

2. The conductive pattern formation ink as claimed in claim 1, further comprising a surface tension adjuster that is contained in the water-based dispersion medium and adjusts surface tension of the ink, wherein the surface tension adjuster contains a compound represented by the following formula (I):

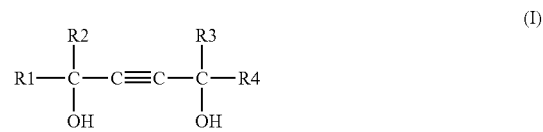

wherein each of R1, R2, R3 and R4 is independently a hydrogen atom or an alkyl group.

3. The conductive pattern formation ink as claimed in claim 2, wherein in the formula (I), the R1 and the R4 have the same chemical structure and the R2 and the R3 have the same chemical structure.

4. The conductive pattern formation ink as claimed in claim 2, wherein a HLB value of the surface tension adjuster is in the range of 2 to 16.

5. The conductive pattern formation ink as claimed in claim 2, wherein the ink contains two or more kinds of the surface tension adjusters having different HLB values, and a HLB value difference between the surface tension adjuster having the highest HLB value and the surface tension adjuster having the lowest HLB value is in the range of 4 to 12.

6. The conductive pattern formation ink as claimed in claim 2, wherein an amount of the surface tension adjuster contained in the ink is in the range of 0.001 to 1 wt %.

7. The conductive pattern formation ink as claimed in claim 1, wherein a surface tension of the ink at 25° C. is in the range of 15 to 45 dyn/cm.

8. The conductive pattern formation ink as claimed in claim 1, wherein a viscosity of the ink at 25° C. is in the range of 3 to 15 mPa·s.

9. The conductive pattern formation ink as claimed in claim 1, wherein the ink is degassed using a gas permeable membrane method.

10. The conductive pattern formation ink as claimed in claim 1, wherein each liquid droplet is landed on the surface of the ceramic molded body in a state that the ceramic molded body is heated at a temperature in the range of 40 to 100° C.

* * * * *